(12) United States Patent
Iga

(10) Patent No.: US 7,525,135 B2
(45) Date of Patent: Apr. 28, 2009

(54) SEMICONDUCTOR DEVICE AND DISPLAY DEVICE

(75) Inventor: Daisuke Iga, Tokyo (JP)

(73) Assignee: NEC Corporation, Tokyo (JP)

( * ) Notice: Subject to any disclaimer, the term of this patent is extended or adjusted under 35 U.S.C. 154(b) by 29 days.

(21) Appl. No.: 11/176,278

(22) Filed: Jul. 8, 2005

(65) Prior Publication Data

US 2006/0006429 A1    Jan. 12, 2006

(30) Foreign Application Priority Data

Jul. 9, 2004    (JP)    ............................. 2004-203057

(51) Int. Cl.
*H01L 27/148* (2006.01)
*H01L 29/768* (2006.01)

(52) U.S. Cl. .................. 257/250; 257/350; 257/351; 257/E21.413; 257/E29.278; 438/588

(58) Field of Classification Search ................ 257/347, 257/350–351, 57, 59, 72, 250, 331, E21.413, 257/E29.278; 438/588
See application file for complete search history.

(56) References Cited

U.S. PATENT DOCUMENTS

| | | | | |
|---|---|---|---|---|
| 5,010,027 A | * | 4/1991 | Possin et al. ................ | 438/159 |
| 5,401,666 A | * | 3/1995 | Tsukamoto ................ | 438/305 |
| 5,648,662 A | * | 7/1997 | Zhang et al. ................ | 257/59 |
| 5,757,030 A | * | 5/1998 | Codama et al. ............... | 257/66 |
| 6,188,108 B1 | * | 2/2001 | Yoon et al. ................... | 257/347 |
| 6,309,917 B1 | * | 10/2001 | Furuta et al. ................ | 438/149 |
| 6,596,573 B2 | * | 7/2003 | Lee et al. ..................... | 438/166 |
| 6,649,500 B2 | * | 11/2003 | Koga ........................... | 438/585 |
| 2003/0170938 A1 | * | 9/2003 | Takahashi .................... | 438/166 |
| 2004/0110329 A1 | * | 6/2004 | Joo et al. ..................... | 438/166 |

FOREIGN PATENT DOCUMENTS

| | | |
|---|---|---|
| JP | H06-005536 | 1/1994 |
| JP | H09-092836 | 4/1997 |
| JP | 2000-138374 | 5/2000 |
| JP | 2001-177103 | 6/2001 |
| JP | 2001-217422 | 8/2001 |
| JP | 2001217422 A * | 8/2001 |

* cited by examiner

*Primary Examiner*—Theresa T Doan
*Assistant Examiner*—Sarah K Salerno
(74) *Attorney, Agent, or Firm*—Dickstein, Shapiro, LLP.

(57) ABSTRACT

On a poly-silicon layer formed on a glass substrate, a gate electrode is formed via a gate insulation film. After forming an impurity-doped region in the poly-silicon layer using the gate electrode as a mask, an insulation layer is formed on the gate electrode and an insulation film is then formed covering these. At this stage, a step which is low in a periphery of the gate electrode but high in a center of the gate electrode is formed in the surface of the insulation layer which formed on the gate electrode, ensuring that the insulation layer and the insulation film on the center of the gate electrode attain a higher reflectance of laser beam than the insulation film and the gate insulation layer on the impurity-doped region do.

6 Claims, 29 Drawing Sheets

SEMICONDUCTOR DEVICE AND DISPLAY DEVICE

BACKGROUND OF THE INVENTION

1. Field of the Invention

The present invention relates to a semiconductor device having a thin film transistor formed on a glass substrate, a method for manufacturing the same and a display device comprising the semiconductor device, and more particularly, to a semiconductor device whose impurity-doped region is activated by a laser annealing method, a method for manufacturing the same and a display device.

2. Description of the Related Art

A poly-silicon (hereinafter referred to as "p-Si" from time to time) thin film transistor (TFT), owing to its high driving capability in comparison to an amorphous-silicon (hereinafter referred to as "a-Si" from time to time) TFT, makes it possible to form a complex drive circuit which is difficult to form using an amorphous-silicon TFT. Further, as indicated by the recent announcement that a central processing unit was formed using a poly-silicon TFT, this is a technology that is attracting particular attention.

In general, poly-silicon TFTs are generally classified into high-temperature poly-silicon TFTs which are fabricated on quartz through a high-temperature step similar to a semiconductor wafer process and low-temperature poly-silicon TFTs the highest temperature for which during fabrication is suppressed down to about the heat resistance temperature of glass. Of these since the low-temperature poly-silicon TFT can be formed on a glass substrate, it is used as a display unit, such as a liquid crystal display device and an electro-luminescence display device, of electronic equipment such as a mobile telephone, a portable information terminal and a personal computer, and applications expected for a flat display device which is driven by an element which is formed on a glass substrate. (See Japanese Published Unexamined Patent Application No. 2001-177103 and Japanese Published Unexamined Patent Application No. 2001-217422, for example.)

Among the steps in manufacturing the low-temperature poly-silicon TFT, the step that requires the highest temperature for processing is the impurity-activating step. A thermal processing temperature at the impurity-activating step, although depending upon the impurity-doping condition, generally requires a temperature of approximately 500° C. While a batch-type furnace annealing is easy to adapt for the impurity activating step, in this case contraction of glass substrate occurs depending upon the type of substrate used and annealing temperature, because a glass substrate is heated at the same time together with a poly-silicon layer. Therefore, for impurity activation using an anneal furnace, it is necessary to use relatively expensive heat-resistant glass as the substrate or required the precompaction process.

Meanwhile, the excimer laser annealing (ELA) activation method has been proposed according to which excimer laser beam irradiated upon a surface of an impurity-doped region of a poly-silicon layer to heats up the poly-silicon layer and activates impurities. Although the ELA activation method realizes selective heating of only the poly-silicon layer without heating the glass substrate, if ELA activation is performed after a gate electrode is formed, because the gate electrode is exposed to laser irradiation, the heat of the laser could damage the gate electrode and the gate electrode could be deformed or quenched.

Noting this, conventionally, for ELA activation for a TFT, such a method has been proposed which permits heating only a selected area to be heated up to a high temperature without adversely influencing an area which should not be heated to a high temperature (See Japanese Patent No. 3211377 for instance.). According to the semiconductor device manufacturing method described in Japanese Patent No. 3211377, utilizing the phenomenon that the reflectance of light cyclically changes depending upon a thickness, a film whose thickness brings about a high reflectance is formed on an area which should avoid heating to a high temperature and a film whose thickness brings about a low reflectance is formed on an area which should be heated up to a high temperature. FIG. 1 is a cross sectional view showing a TFT structure in the semiconductor device described in Japanese Patent No. 3211377. As shown in FIG. 1, in the semiconductor device described in Japanese Patent No. 3211377, within an area partitioned by element isolation regions 102 in the surface of an Si substrate 101, there are a pair of highly-doped regions 111 that serve as a source or a drain and a pair of LDD (Lightly Doped Drain) regions 109, and on a channel region between the paired LDD regions 109, a gate electrode 107a is formed upon a gate insulation film 103. Further, there are sidewalls 110 at the both side surfaces of the gate electrode 107a, and a SiO₂ layer 112 is formed covering these. In this semiconductor device, the SiO₂ layer on the highly-doped regions 111 (the gate insulation film 103 and the SiO₂ layer 112) is set to a thickness which minimizes the reflectance of laser beam, whereas the SiO₂ layer on the gate electrode 107a (a SiO₂ layer 108a and the SiO₂ layer 112) is set to a thickness which maximizes the reflectance of the laser beam. Since this maximizes the reflectance of the laser beam on the gate electrode 107a but minimizes the laser beam in the impurity-doped region, it is possible to activate impurities while preventing deformation of the gate.

The semiconductor device described in Japanese Patent NO. 3211377 fabricated as the SiO₂ layer 108a is formed on the gate electrode 107a in which a poly-crystalline silicon film 104a, a tungsten silicide film 105a and a poly-crystalline silicon film 106a are stacked in this order on top of each other, resist patterning is performed by photolithography, the SiO₂ layer 108a, the poly-crystalline silicon film 104a, the tungsten silicide film 105a and the poly-crystalline silicon film 106a are dry-etched, thereby forming the gate electrode 107a, and the SiO₂ layer 112 is then formed covering the entirety.

While the manufacturing method above described in Japanese Patent No. 3211377 is an invention on the assumption that a single-crystal silicon substrate is used, application of this method which requires forming the laser reflection film on the gate electrode to a TFT which is formed on a glass substrate has been studied (Japanese Published unexamined Patent Application No. 92836/1997 and Japanese Published Unexamined Patent Application No. 2000-138374, for example.). According to Japanese Published Unexamined Patent Application No. 92836/1997 and Japanese Published Unexamined Patent Application No. 2000-138374, an insulation film whose thickness corresponds to the wavelength of laser beam is formed on a TFT that comprises a gate electrode of a single-layer structure. To be more specific, in the poly-silicon thin film transistor described in Japanese Published Unexamined Patent Application No. 92836/1997, the thickness of an inter-layer insulation film on a gate electrode is set to such a range in which the transmittance of laser beam remains the lowest, thereby effectively reducing the energy of the laser beam which reaches the gate electrode and preventing the gate electrode from being peeled from gate inter-layer insulation film, and in a source region and a drain region, the total thickness of the gate electrode and the inter-layer insulation film is set to such a range in which the transmittance of the laser beam becomes the highest, thereby ensuring that the energy of the laser beam reaches the source region and the drain region and activation is taken palace efficiently. Meanwhile, the semiconductor device described in Japanese Published Unexamined Patent Application No. 2000-138374 is a semiconductor device in which a TFT is formed on a glass substrate, and the insulation film formed on an active region has a thickness which reduces the reflectance of the laser, whereas the insulation film formed on another area than the active region has a thickness which increases the reflectance of the laser beam.

However, the conventional techniques above have the following problems when applied to a large-area glass-substrate based fabrication process. That is, when a large-size glass substrate is used, the process becomes less uniform than where a silicon substrate is used, and therefore, it is difficult to form the gate electrodes of the TFTs and reflection films uniformly all over the substrate, which is a problem. Although TFTs with their gate structures consist of single-layer may have acceptable uniformity, in particular, as in the case of the TFTs described in Japanese Published unexamined Patent Application NO. H9-92836 and Japanese Published Unexamined Patent Application No. 2000-138374, TFTs those of having the gate structures consist of more than 2 layers in an attempt to control a threshold voltage and improve electric characteristics as in the case of the semiconductor device described in Japanese Patent No. 3211377, have inferior uniformity due to the process thus it is difficult to obtain similar shape all over the substrate.

A description will now be given on a problem which occurs when laser reflection films are disposed on gate electrodes while TFTs comprising gate electrodes of a multi-layer structure are formed on a large-size glass substrate, with reference to an example of TFTs comprising gate electrodes having a double-layer structure in which a Cr layer and a micro-crystalline silicon (hereinafter referred to as "μc-Si" from time to time) are stacked up. FIG. 2 through FIG. 4 are cross sectional views showing a problem which occurs when a laser reflection film is formed on a gate electrode having a double-layer structure, and in each drawing, A shows a center of a substrate, whereas B shows a periphery of the substrate. In cases where a SiO$_2$ layer 128 which is a laser reflection film is formed on a gate electrode having a double-layer lamination structure in which a Cr layer 127 and a μc-Si layer 126 are stacked up, first, an underlying insulation layer 122 is formed on the entire surface of a glass substrate 121, and after a poly-silicon layer 124 which forms an impurity-doped region 123 is formed on the underlying insulation layer 122, a gate insulation layer 125 is formed so as to cover the poly-silicon layer 124. After the μc-Si layer, the Cr layer and the SiO$_2$ layer are formed in this order on the gate insulation layer 125, a resist pattern for the gate electrode is formed by photolithography, thereby forming a TFT in which the SiO$_2$ layer 128 is formed by dry etching on the gate electrode in which the Cr layer 127 and the μc-Si layer stacked up.

However, in the TFT having this structure, under a condition which results a desired shape as designed in the center of the substrate as shown in FIG. 2A, a side-etched portion 129 occurs in the μc-Si layer 126 within the periphery of the substrate, and further, an over-etched portion 130 occurs in the gate insulation layer 125 as shown in FIG. 2B. Meanwhile, under a condition which results a desired it possible to obtain a shape as designed in the periphery of the substrate, as shown in FIG. 3B, etching of the μc-Si layer 126 is insufficient within the center of the substrate, and a film remaining portion 131 is formed as shown in FIG. 3A. Although the center of the substrate becomes as designed as shown in FIG. 4A as a result of etching which is executed under such a condition that will not create the side-etched portion 129 and the over-etched portion 130 as those shown in FIG. 2B, and the film remaining portion 131 as that shown in FIG. 3A, the SiO$_2$ layer 128 which is a laser reflection film overhangs within the periphery of the substrate as shown in FIG. 4B. When the SiO$_2$ layer 128 overhangs, the coverage of the overlying inter-layer film becomes insufficient and therefore disconnections, short circuits and the like are generated. These problems are attributable to the inferior uniformity of the process unique to the large-size glass substrate and to different etching rate characteristics between Cr and μc-Si.

Note that in the actual fabrication process of low-temperature poly silicon TFT applications, the problems shown in FIG. 2B, FIG. 3A and FIG. 4B can occur simultaneously in any combination with each other in case the gate structure of choice for the TFT is consist of more than 2 layers of different materials that have different etching speed.

SUMMARY OF THE INVENTION

An object of the present invention is to provide a semiconductor device in which an area other than an impurity-doped region is less thermally damaged during impurity activation by excimer laser annealing when a thin film transistor having a gate electrode of a multi-layer structure is formed on a large-size insulation transparent substrate, to provide a method for manufacturing the same and to provide a display device comprising the semiconductor device.

The semiconductor device according to the present invention comprises: a transparent insulation substrate; a poly-silicon layer formed on the substrate; a source region and a drain region formed by activating two separated regions in an impurity-doped region which is formed in the poly-silicon layer, with irradiation of laser beam; a channel region formed between the source region and the drain region in the poly-silicon layer; a first insulation layer which is formed on the poly-silicon layer and which is to serve as a gate insulation layer; a gate electrode having a plurality of stacked layers of mutually different materials, the gate electrode being formed on a portion of the first insulation layer that is above the channel region; and a second insulation layer which covers the gate electrode and the gate insulation layer, the second insulation layer having a surface with a step above the gate electrode, in which the surface of the second insulation layer is low in a periphery of the gate electrode but high in a center of the gate electrode. And the source region and the drain region are formed by irradiation of laser beam through the first insulation layer and the second insulation layer, the reflectance of the laser beam at a portion of the second insulation layer above the center of the gate electrode is higher than the reflectance of the laser beam at portions of a first multi-layer insulation film consisting of the first insulation layer and the second insulation layer above the source region and the drain region.

According to the present invention, since the step is formed in the surface of the second insulation layer on the gate electrode, even when having inferior uniformity between a center of the substrate and a periphery of the substrate, the second insulation layer does not overhang. This prevents the coverage of the overlying inter-layer film from becoming insufficient, and hence, associated disconnections, short circuits and the like are not generated. In addition, since the second insulation layer on the center of the gate electrode has such a thickness that realizes a high reflectance of laser beam, it is possible to suppress thermal damaging of the gate electrode.

The width of the step formed in the surface of the second insulation layer is equal to or narrower than ¼ of the width of the gate electrode. This suppresses the influence of the laser beam upon the gate electrode.

On the center of the gate electrode, there may be a third insulation layer which has a narrower width than the gate electrode in the traverse section and is formed of the same material as the second insulation layer, and the reflectance of a portion of the laser beam at a second multi-layer insulation film consisting of the third insulation layer and the second insulation layer above the gate electrode, may be higher than the reflectance of the laser beam at the first multi-layer insulation film. This makes it easy to form the step on the second insulation layer.

In addition, the first insulation layer and the second insulation layer may be formed of $SiO_2$, for example. Further, the gate electrode may be formed of a micro-crystalline silicon layer and a Cr layer. Still further, an LDD region may be formed in the impurity-doped region.

A method for manufacturing a semiconductor device, comprises the steps of: forming a poly-silicon layer on a transparent insulation substrate; forming a first insulation layer, which is to serve as a gate insulation layer, on the poly-silicon layer; forming a gate electrode by stacking up a plurality of layers of mutually different materials on the first insulation layer; forming an impurity-doped region by implanting impurities into the poly-silicon layer, self-aligned with respect to the gate electrode; forming a second insulation layer so as to cover the gate electrode and the first insulation layer; and forming a source region and a drain region by activating, with irradiation of laser beam, the impurity-doped region. And in the step of forming the second insulation layer, a step is formed within a portion of the surface of the second insulation layer above the gate electrode, the step is low above a periphery of the gate electrode but high above a center of the gate electrode, and the reflectance of the laser beam at a portion of the second insulation layer above the center of the gate electrode is made higher than the reflectance of the laser beam at a portion of a first multi-layer insulation film consisting of the first insulation layer and the second insulation layer and formed above the impurity-doped region.

According to the present invention, since the step is formed in the surface of the second insulation layer on the gate electrode, it is possible to prevent defects that are attributed to etching rate characteristics, etc. Further, since the second insulation layer on the center of the gate electrode has a thickness that realizes a high reflectance of laser beam, it is possible to suppress thermal damaging of the gate electrode during annealing.

The width of the step formed in the surface of the second insulation layer may be equal to or narrower than ¼ of the width of the gate electrode. This suppresses damaging of the gate electrode during annealing with laser beam.

Further, before forming the second insulation layer, on the center of the gate electrode, a third insulation layer which has a narrower width than the gate electrode in the traverse section may be formed with the same material as the second insulation layer, and the reflectance of the laser beam at a portion of a second multi-layer insulation film consisting of the third insulation layer and the second insulation layer formed above the gate electrode, may be higher than the reflectance of the laser beam at the first multi-layer insulation film. Alternatively, etching may be performed to adjust the thickness of the second insulation layer that is formed on the periphery of the gate electrode and that of the second insulation layer formed on the impurity-doped region. This permits forming the step on the second insulation layer and attains easy adjustment of the thickness of the second insulation layer.

In addition, the first insulation layer and the second insulation layer may be formed with $SiO_2$, for instance. Further, the gate electrode may be formed of a micro-crystalline silicon layer and a Cr layer. Still further, at the step of forming the impurity-doped region, after impurities are implanted at a high concentration into the poly-silicon layer with a mask which covers on top of an area where the LDD is to be formed, the mask may be removed, and impurities may be implanted at a low concentration into the poly-silicon layer, self-aligned with respect to the gate electrode. This makes it possible to form an LDD region in the impurity-doped region.

A display device according to the present invention comprises the semiconductor device above.

According to the present invention, when a thin film transistor having a gate electrode of a multi-layer structure is formed on a large-size insulation transparent substrate, it is possible to perform impurity activation by excimer laser annealing while permitting the influence owing to inevitable non-uniformity but without damaging the gate electrode.

BRIEF DESCRIPTION OF THE DRAWINGS

FIG. 14A is a cross sectional view showing a side-etched portion in the semiconductor device according to the second embodiment of the present invention, while

DETAILED DISCRIPTION OF THE PREFERRED EMBODIMENTS

Figure 5:
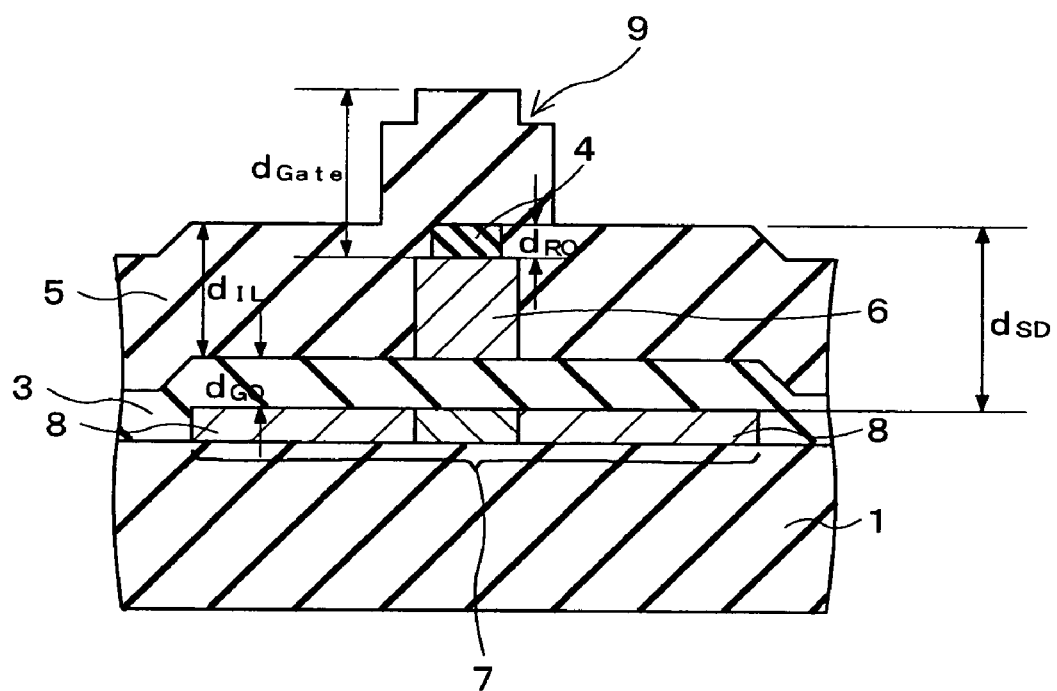
FIG. 5 is a cross sectional view showing a semiconductor device according to a first embodiment of the present invention.

Hereinafter, semiconductor devices according to embodiments of the present invention will be described in detail with reference to the accompanying drawings. First, a semiconductor device according to a first embodiment of the present invention will be described. FIG. 5 is a cross sectional view showing the semiconductor device according to the present embodiment. As shown in FIG. 5, in the semiconductor device according to the present embodiment, a poly-silicon layer 7 is formed on a transparent insulation substrate 1 of glass, plastic, quartz, sapphire or the like for instance, and an impurity-doped region 8 is formed the poly-silicon layer 7. Further, a gate insulation film 3 is formed on the poly-silicon layer 7, and a gate electrode 6 is formed on the gate insulation film 3 by stacking up a plurality of layers of mutually different materials. An insulation layer 4 that is narrower than the gate electrode 6 is formed on the gate electrode 6, and an insulation layer 5 is further disposed covering the entire structure. In the semiconductor device according to the present embodiment, since the insulation layer 4 is formed on the gate electrode 6, the surface of the overlying insulation layer 5 has a step 9 that is low in a periphery but high in a center.

Figure 6:
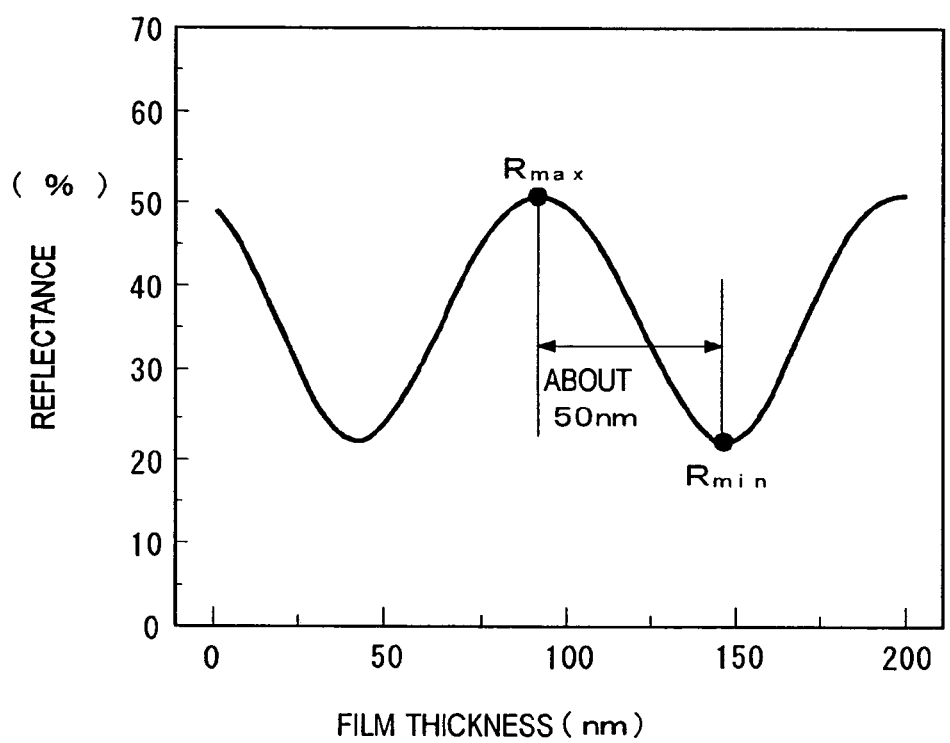
FIG. 6 is a graph showing a relationship between a thickness of a $SiO_2$ layer and the reflectance of excimer laser beam, with the horizontal axis representing the thickness of the $SiO_2$ layer and the vertical axis representing the reflectance of the 308-nm excimer laser beam.

It is now assumed that the thicknesses of the gate insulation layer 3, the insulation layer 4 and the insulation layer 5 are respectively $d_{GO}$, $d_{RO}$ and $d_{IL}$, the total thickness of these insulation layers which are formed on the impurity-doped region 8 is $d_{SD}$, and the total thickness of these insulation layers which are formed on the gate electrode 6 is $d_{Gate}$. Further, assuming that the reflectance of laser beam at these layers which are formed on the gate electrode is $R_G$ and the reflectance of the laser beam at these layers which are formed on the impurity-doped region 8 is $R_{SD}$, the thickness $d_{Gate}$ and the thickness $d_{SD}$ are set in the semiconductor device according to the present embodiment such that $R_G > R_{SD}$ is satisfied.

Where the wavelength of light is λ and the refraction coefficient of a film is n, the reflectance of the film with respect to the light whose wavelength is λ becomes maximum and minimum in the cycles of λ/2n. FIG. 6 is a graph which shows a relationship between a thickness of a $SiO_2$ film and the reflectance of XeCl excimer laser beam, with the horizontal axis representing the thickness of the $SiO_2$ film and the vertical axis representing the reflectance of the XeCl excimer laser beam whose wavelength is 308 nm.

Figure 7:
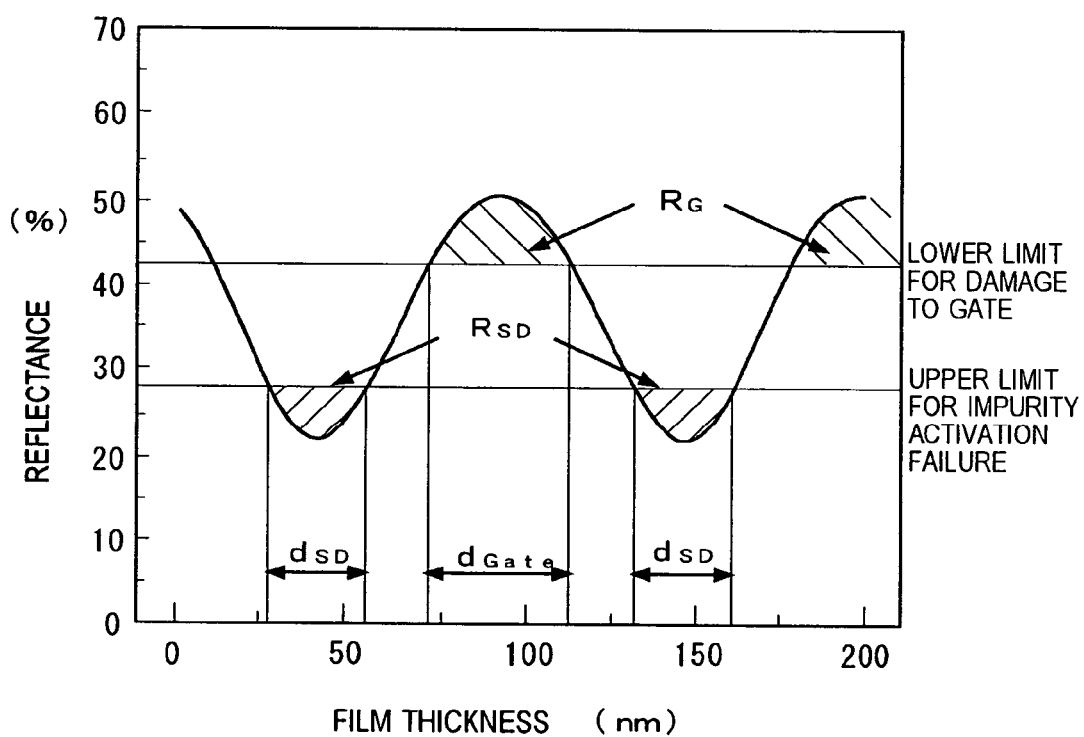
FIG. 7 is a drawing showing a thickness of a $SiO_2$ layer that is suitable for XeCl excimer laser beam whose wavelength is 308 nm.

As shown in FIG. 6, while the thickness $d_{GO}$, the thickness $d_{RO}$ and the thickness $d_{IL}$ are ideally set such that $d_{Gate}$=90 nm and $d_{SD}$=150 nm are satisfied in the semiconductor device according to the present embodiment, for practical purposes, any combination may be used which assures sufficiently high reflectance at the thickness $d_{Gate}$, for not inducing damage on the gate electrode 6 and sufficiently low reflectance at the thickness $d_{SD}$, for permitting sufficient energy for impurity activation reaching the impurity-doped region 8 in the poly-silicon layer 7. FIG. 7 is a drawing showing a thickness of a $SiO_2$ layer, which is suitable for XeCl excimer laser beam whose wavelength is 308 nm. For example, the thickness $d_{GO}$, the thickness $d_{RO}$ and the thickness $d_{IL}$ that realize the thickness $d_{Gate}$ and the thickness $d_{SD}$ shown in FIG. 7 may be set.

Figure 8A:
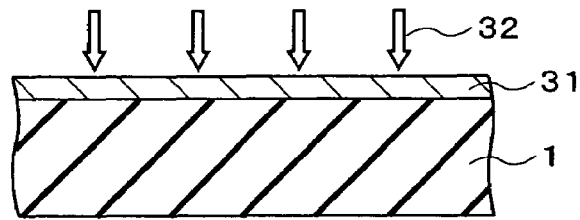
FIG. 8A through FIG. 8D are cross sectional views showing a method for manufacturing the semiconductor device according to the first embodiment of the present invention, in the order of manufacturing steps.
Figure 8B:
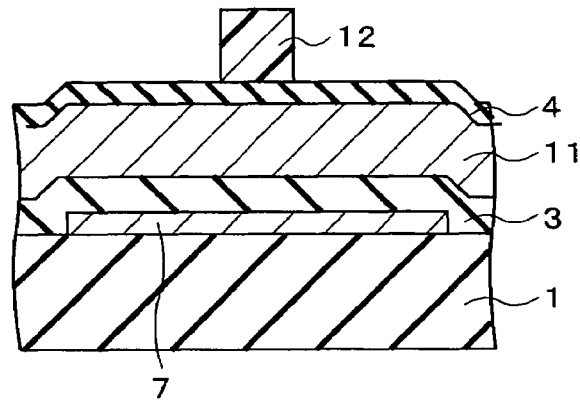
Figure 8C:
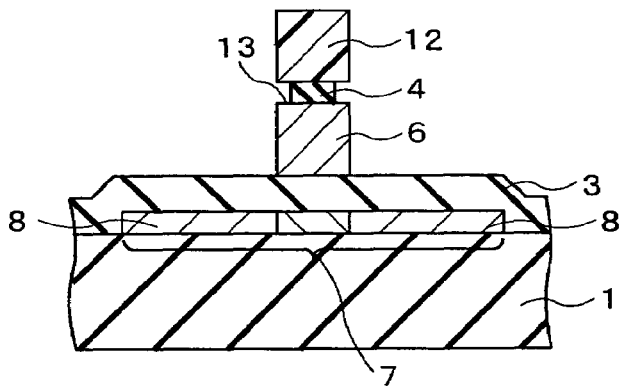

A method for manufacturing the semiconductor device according to the present embodiment will now be described. FIG. 8A through FIG. 8D are cross sectional views showing the method for manufacturing the semiconductor device according to the present embodiment, in the order of manufacturing steps. First, as shown in FIG. 8A, after an amorphous-silicon layer 31 is formed on the transparent insulation substrate 1 of glass or the like by the CVD (Chemical Vapor Deposition) method, annealing is executed, whereby the amorphous silicon layer 31 becomes poly-silicon. Laser annealing, thermal annealing or the like may be performed as the annealing. Following this, element isolation is executed by etching, and as shown in FIG. 8B, the gate insulation film 3 is formed entirely on the substrate 1 by the CVD method, a gate metal layer 11 is deposited by sputtering on the gate insulation layer 3, and the insulation layer 4 is formed on the gate metal layer 11 by the CVD method. The thickness of the insulation layer 4 remains, is after the insulation layer 5 has been formed, within the ranges of $d_{GATE}$ and $d_{SD}$ shown in FIG. 7 at the wavelength of laser that is used for activation annealing. After forming a photo mask 12 by photolithography, as shown in FIG. 8C, the insulation layer 4 and the gate metal layer 11 in which a plurality of layers of mutually different materials are stacked up are simultaneously patterned, thereby forming the gate electrode 6. For the element isolation and the patterning of the gate electrode 6, an ordinary dry etching method or the like may be used.

Figure 8D:
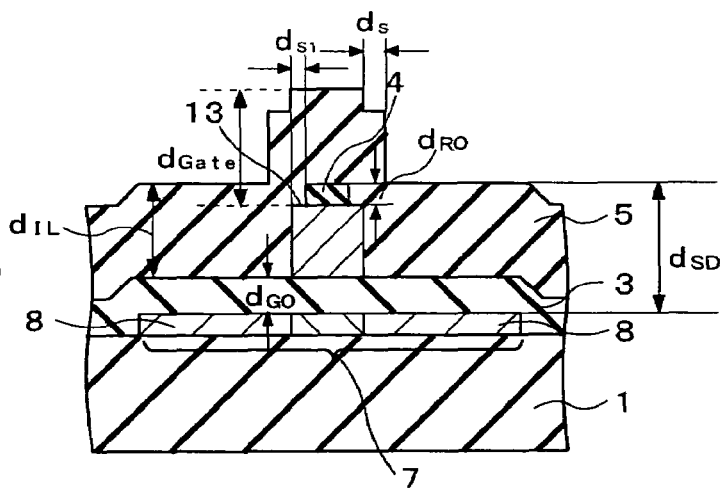

During the patterning of the gate electrode 6, considering the anisotropy of etching and the etching rates of the gate electrode 6 and the insulation layer 4, such a condition is implemented that provides a desired shape to the gate electrode 6 and makes the insulation layer 4 narrower than the gate electrode 6, i.e., generates a side-etched portion 13 in the insulation layer 4. Impurity implantation then follows, whereby the impurity-doped region 8 is formed. The impurity implantation may be performed with the photo mask 12 remaining as it is, or self-aligned using the gate electrode 6 as a mask. The photo mask 12 is then removed as shown in FIG. 8D, the insulation layer 5 is formed by the CVD method. The thickness of the insulation layer 5, including that of the insulation layer 4 formed earlier, is kept in the range $d_{Gate}$ shown in FIG. 7 on the impurity-doped region 8 but in the ranges $d_{SD}$ shown in FIG. 7 on the gate electrode 6 at the wavelength of the laser which is used for the activation annealing. As a result, in the surface of the insulation layer 5 formed on the gate electrode 6, the step 9 is created whose width corresponds to the width $d_{S1}$ of the side-etched portion 13 in the insulation layer 4. The excimer laser is thereafter irradiated and the impurity-doped region 8 is activated. This completes the TFT in the semiconductor device according to the present embodiment.

Figure 9A:
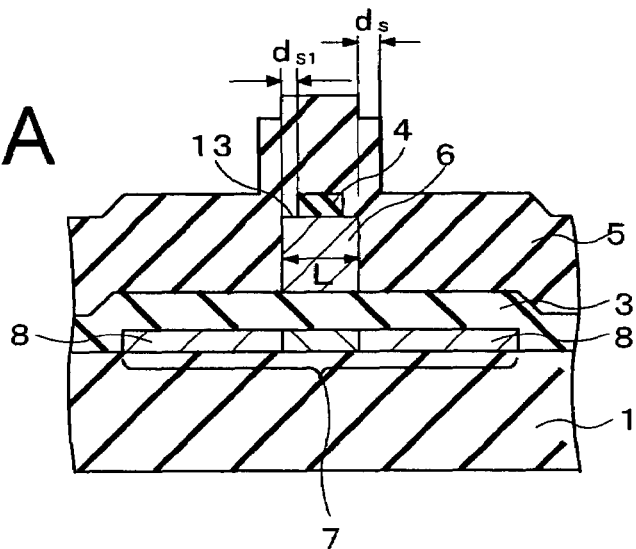
FIG. 9A is a cross sectional view showing a side-etched portion 13.
Figure 9B:
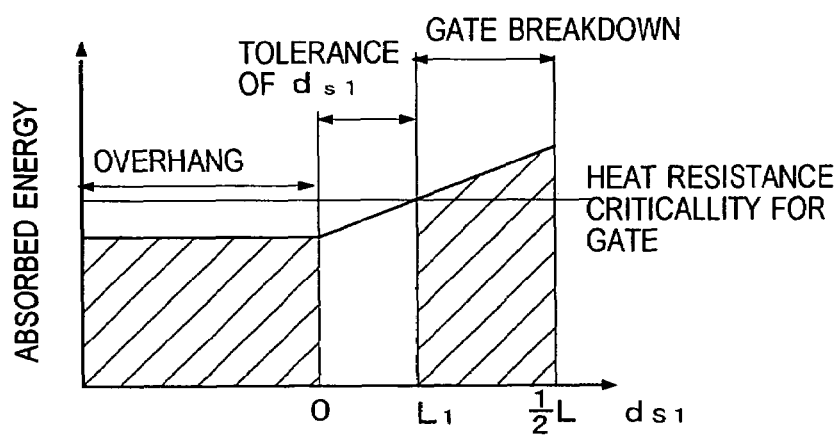
FIG. 9B is a graph showing a relationship between the width of the side-etched portion and absorbed energy at a gate electrode, with the horizontal axis representing the width of the side-etched portion and the vertical axis representing the absorbed energy at the gate electrode 6.
Figure 9C:
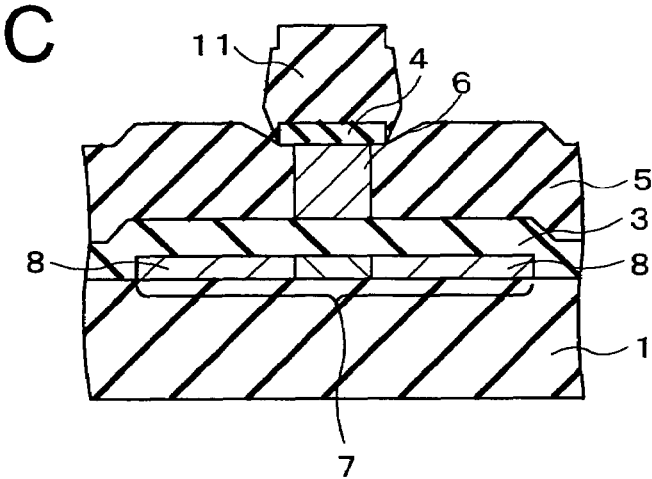
FIG. 9C is a cross sectional view showing an insulation layer as it overhangs.

A relationship between the size of the side-etched portion 13 in the insulation layer 4 and damage that would deal to the gate electrode 6 will now be described. FIG. 9A is a cross sectional view showing the side-etched portion 13, FIG. 9B is a graph showing a relationship between the width of the side-etched portion and absorbed energy at the gate electrode, with the horizontal axis representing the width of the side-etched portion and the vertical axis representing the absorbed energy at the gate electrode 6, and FIG. 9C is a cross sectional view showing an insulation layer as it overhangs. The distance from the edge of the gate electrode 6 to the insulation layer 4 is defined as the width $d_{S1}$ of the side-etched portion 13 for instance as shown in FIG. 9A. When the width $d_{S1}$ is narrower than 0, that is, when the both edges of the insulation layer 4 hang over beyond the gate electrode 6 toward the outside, the insulation layer 4 and the insulation layer 5 completely coat the gate electrode 6, and therefore, the absorbed energy at the gate electrode 6 is constant. However, since the overhang shape of the insulation layer 4 results in insufficient coverage as shown in FIG. 9C, the width $d_{S1}$ of the side-etched portion is not usually set narrower than 0.

On the contrary, when the width $d_{S1}$ of the side-etched portion 13 is wider than 0 as shown in FIG. 9B, the size of the area where the insulation layer 4 covers the gate electrode 6 decreases and the energy absorbed by the gate electrode 6 consequently increases in inverse proportion to the size of the area covered by the insulation layer 4. Assuming the width of the gate electrode 6 is L, the gate electrode 6 is distorted when $d_{S1}$ reaches $L_1$ where the absorbed energy exceeds critical value that induces sever damage to the gate electrode 6. Noting this, in the semiconductor device according to the present embodiment, the width $d_{S1}$ of the side-etched portion 13 is within such a range which does not permit overhang and prevents the gate electrode 6 from being damaged, that is, $0<d_{S1}<L_1$. As for the side-etched portion 13, while it is difficult to ensure the same shape all over the substrate because of non-uniformity due to the nature of large scale glass substrate process, the width $d_{S1}$ is ideally within the range of $0<d_{S1}<L_1$ all over the substrate. While the value $L_1$ changes depending upon the materials of the gate electrode 6, the wavelength and the intensity of the laser beam which is used, etc., in the event that the activation process uses an excimer laser as in the case of the semiconductor device according to the present embodiment, it is ideal that the width $d_{S1}$ of the side-etched portion 13 is set so that the width $d_s$ of the low portion of the step created in the surface of the insulation layer 5 is ¼ of the width L of the gate electrode 6 or narrower, for instance.

In the semiconductor device according to the present embodiment, since the convex-shape step which is low in the periphery but high in the center is created in the area of the surface of the insulation layer 5, which is a laser reflection film, above the gate electrode 6, the insulation layer 5 is assured not to form overhang even the cross sectional shape varies between the center and the periphery of the substrate due to the non-uniformity of the process. Even when a wire is formed across the gate electrode 6 on the insulation layer 5 therefore, it is possible to prevent disconnections that will otherwise not be generated by insufficient coverage. In addition, since the total thickness of the insulation layer 4 and the insulation layer 5 formed on the center of the gate electrode 6 is set so that the reflectance of the laser beam will be high and the total thickness of the gate insulation layer 3 and the insulation layer 5 formed on the impurity-doped region 8 is set so that the reflectance of the laser beam will be low, it is possible to activate the impurities by excimer laser annealing without damaging the gate electrode.

Figure 10A:
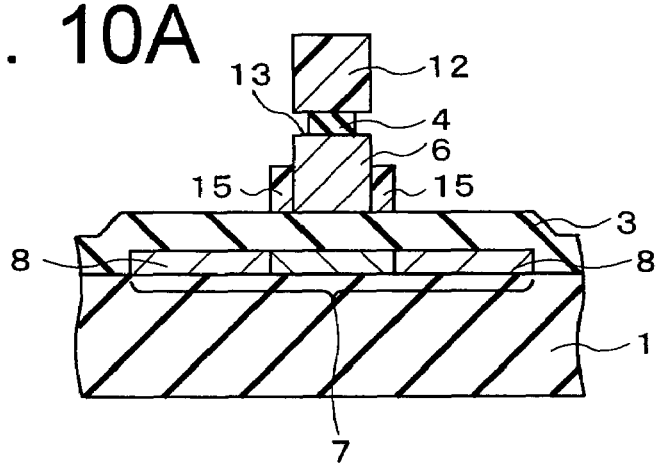
FIG. 10A through FIG. 10C are cross sectional views showing a method for forming an LDD region in the semiconductor device according to the first embodiment of the present invention, in the order of manufacturing steps, with 10A showing a step which follows FIG. 8B.
Figure 10B:
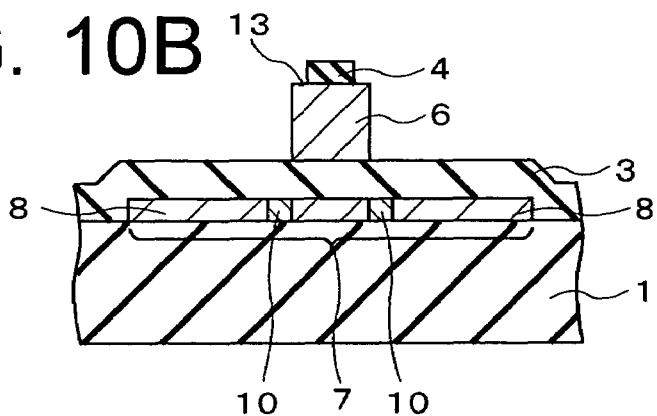
Figure 10C:
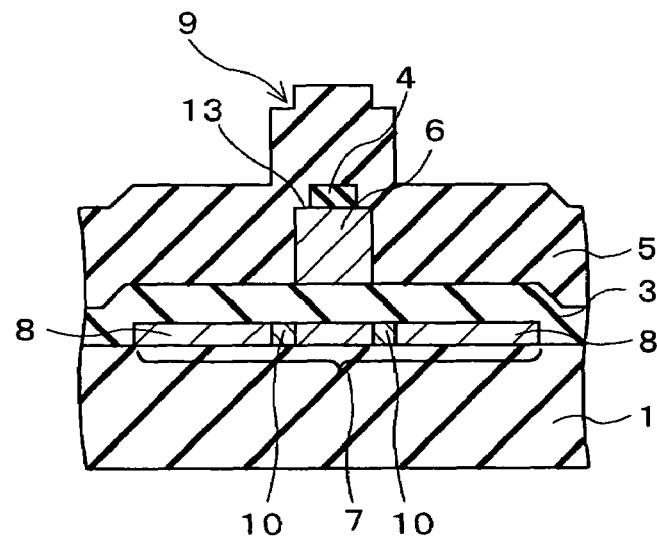

Although the semiconductor device according to the present embodiment does not comprise an LDD region, the present invention is not limited to this but may be applied to a semiconductor device having an LDD structure. A modified example of the semiconductor device according to the present embodiment will now be described. FIG. 10A through FIG. 10C are cross sectional views showing a method for forming the modified example of the semiconductor device according to the present embodiment, of which FIG. 10A shows a step that follows FIG. 8B. As shown in FIG. 10C, in the semiconductor device according to the modified example of the present embodiment, an LDD region 10 is formed in the poly-silicon layer 7. During fabrication of this semiconductor device, first, after forming the gate electrode 6 and the insulation layer 4 by a similar method to the above for the semiconductor device according to the first embodiment described above, a photo mask 15 is formed in the LDD region 10 and impurities are implanted at a high concentration into the poly-silicon layer 7. The photo mask 15 is then removed as shown in FIG. 10B, and after implanting impurities at a low concentration into the poly-silicon layer 7 using the gate electrode 6 as a mask, the insulation layer 5 is formed by the CVD method as shown in FIG. 10C. An excimer laser is then irradiated, thereby activating the LDD region 10 and the impurity-doped region 8 and completing the TFT in the semiconductor device according to this modified example. The structures and the effect of the semiconductor device according to this modified example other than those described above are similar to those described earlier in relation to the semiconductor device according to the first embodiment.

Figure 11A:
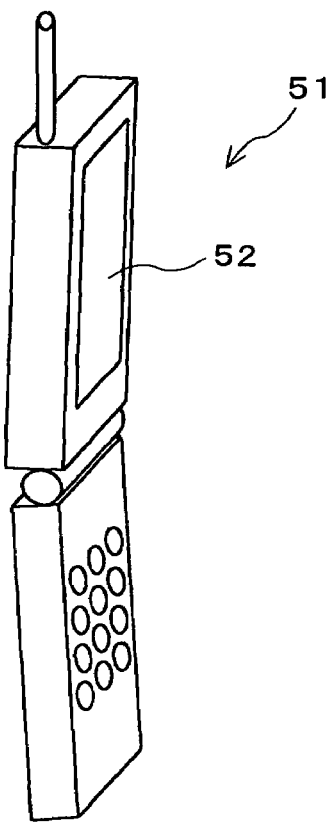
FIG. 11A and FIG. 11B are perspective views showing display devices comprising the semiconductor device according to the first embodiment of the present invention.
Figure 11B:
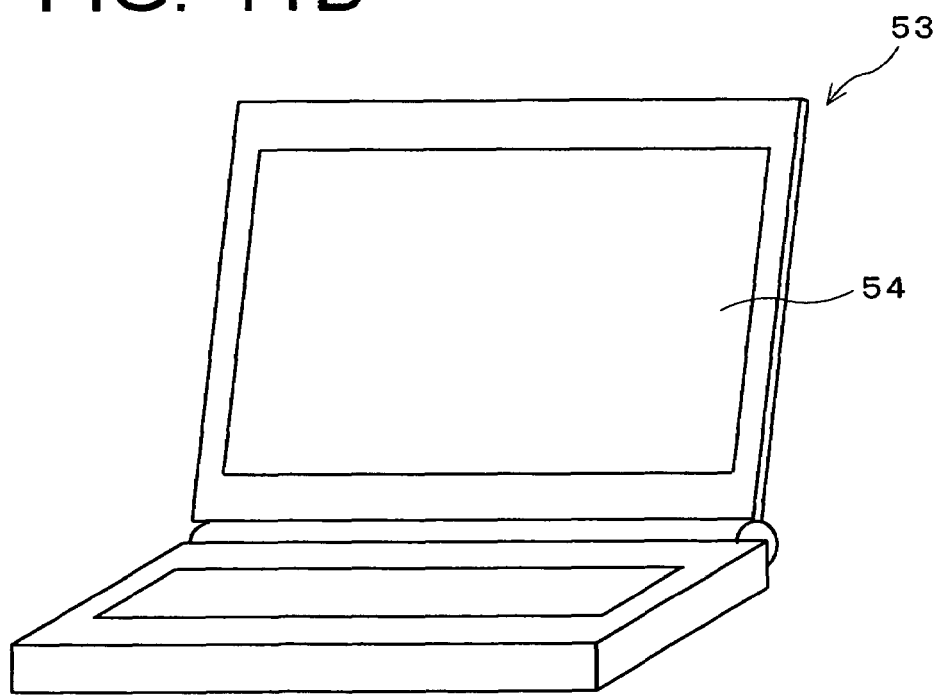

The semiconductor devices according to the first embodiment and the modified example of the same are mounted in various types of display devices, for example. FIG. 11A and FIG. 11B are perspective views showing display devices comprising the semiconductor device according to the first embodiment of the present invention. For instance, the semiconductor device according to the first embodiment of the present invention is mounted in a display unit 52 of a mobile telephone 51 as that shown in FIG. 11A, a display unit 53 of a personal computer as that shown in FIG. 11B, etc.

Figure 12:
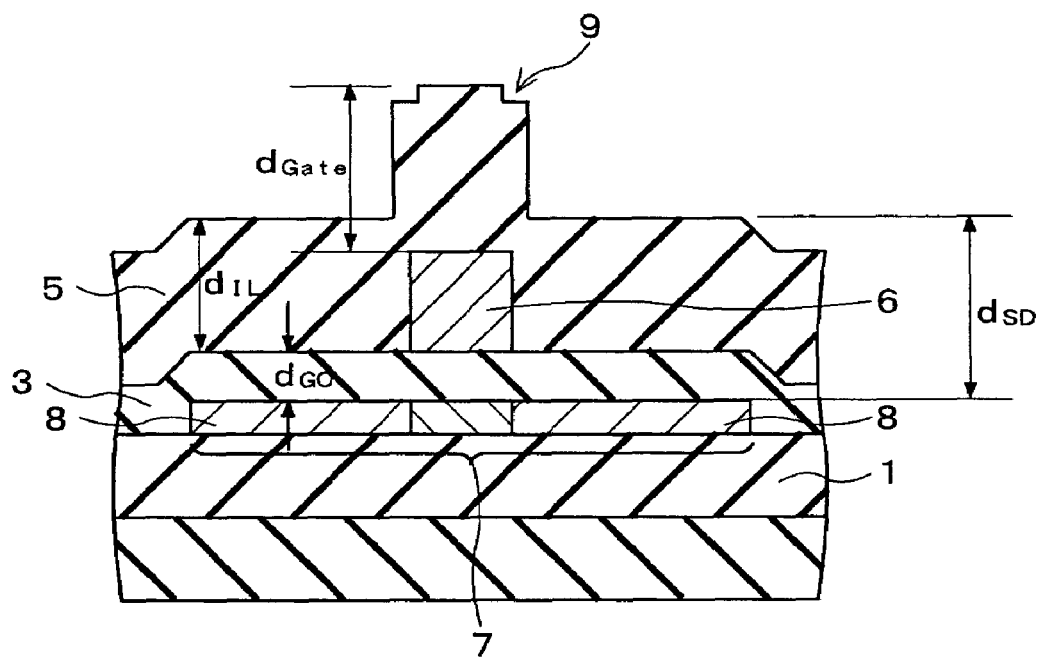
FIG. 12 is a cross sectional view showing a semiconductor device according to a second embodiment of the present invention.

The semiconductor device according to the second embodiment of the present invention will now be described. FIG. 12 is a cross sectional view showing the semiconductor device according to the present embodiment. As shown in FIG. 12, in the semiconductor device according to the present embodiment, the poly-silicon layer 7 comprising the impurity-doped region 8 is formed on the transparent insulation substrate 1 of glass or the like, and the gate insulation layer 3 is formed on the poly-silicon layer 7. The gate electrode 6 is formed on the gate insulation film 3 by stacking up a plurality of layers of mutually different materials, and the insulation layer 5 is disposed covering the entire structure. In the surface of the insulation layer 5 formed on the gate electrode, there is the step that is low in the periphery but high in the center.

It is now assumed that the thicknesses of the gate insulation film 3 formed on the impurity-doped region 8 is $d_{GO}$, the thicknesses of the insulation layer 5 is $d_{IL}$, the total thickness of the gate insulation layer 3 and the insulation layer 5 is $d_{SD}$ and the thicknesses of the insulation layer 5 formed on the gate electrode 6 is $d_{Gate}$. Further assuming that the reflectance of laser beam at these layers which are formed on the gate electrode 6 is $R_G$ and the reflectance of the laser beam at these layers which are formed on the impurity-doped region 8 is $R_{SD}$, $d_{Gate}$ and $d_{SD}$ are set in the semiconductor device according to the present embodiment such that $R_G > R_{SD}$ is satisfied.

Figure 1:
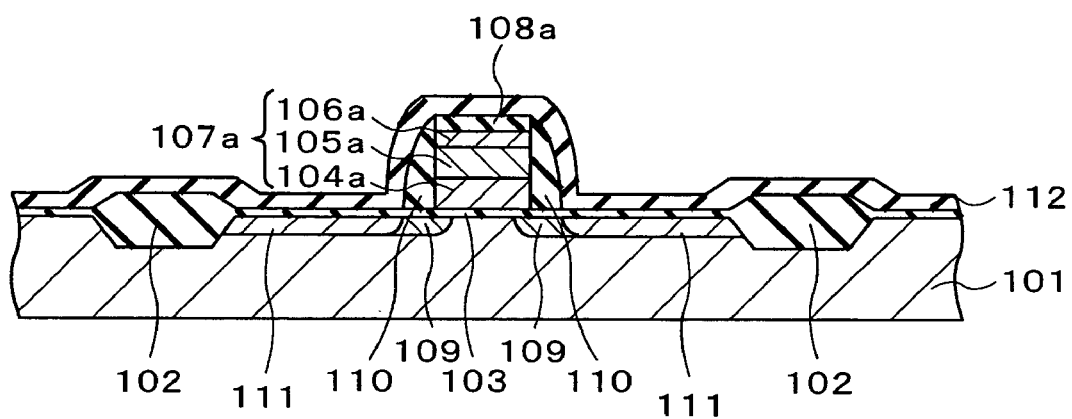
FIG. 1 is a cross sectional view showing a TFT structure in the semiconductor device described in Japanese Patent No. 3211377.
Figure 2A:
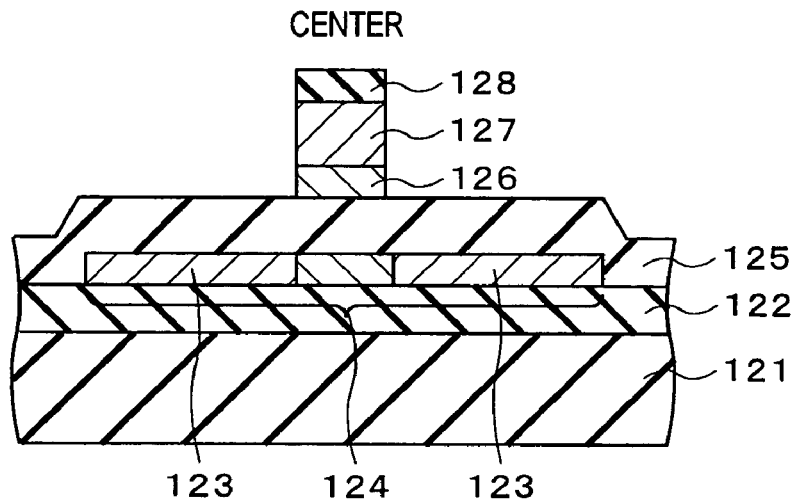
FIGS. 2A and 2B are cross sectional views showing a problem which occurs when a laser reflection film is formed on a gate electrode having a double-layer structure, with 2A showing a center of a substrate and 2B showing a periphery of the substrate.
Figure 2B:
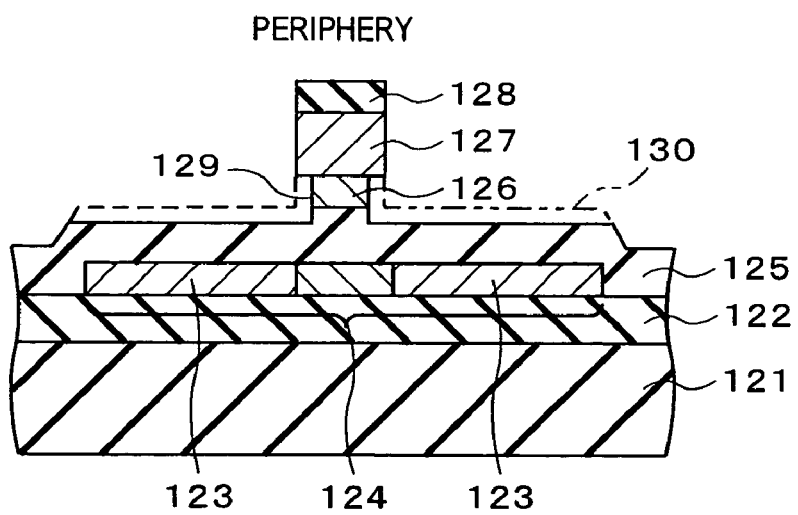
Figure 3A:
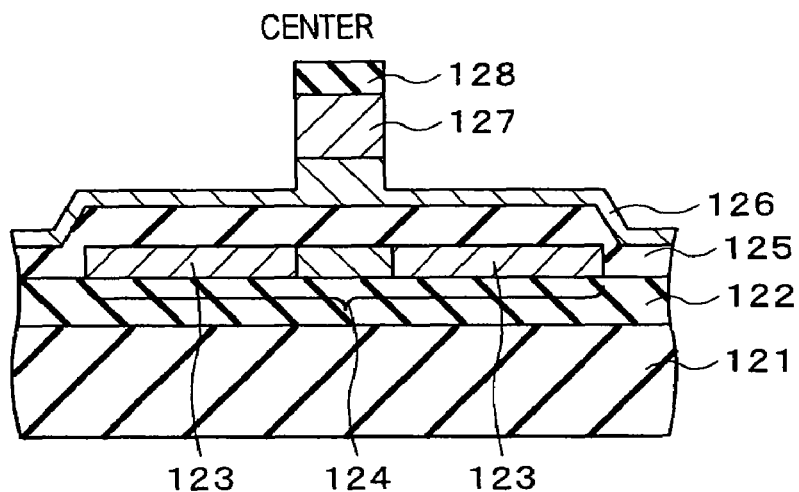
FIGS. 3A and 3B are cross sectional views showing a problem which occurs when a laser reflection film is formed on a gate electrode having a double-layer structure, with 3A showing a center of a substrate and 3B showing a periphery of the substrate.
Figure 3B:
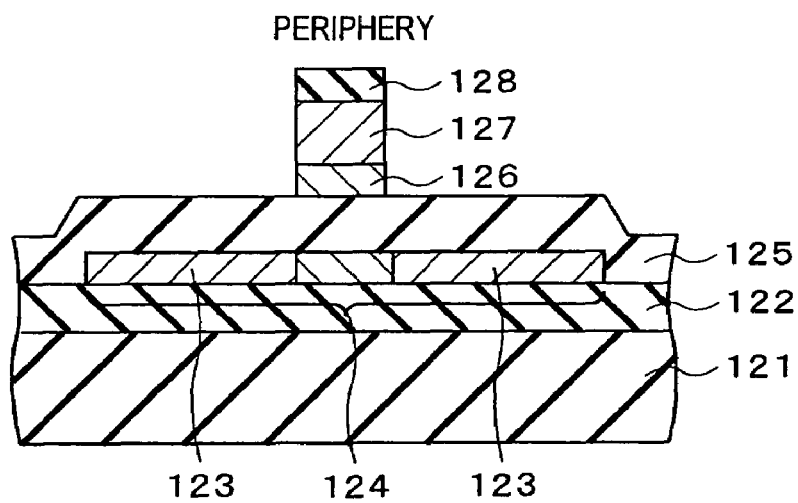
Figure 4A:
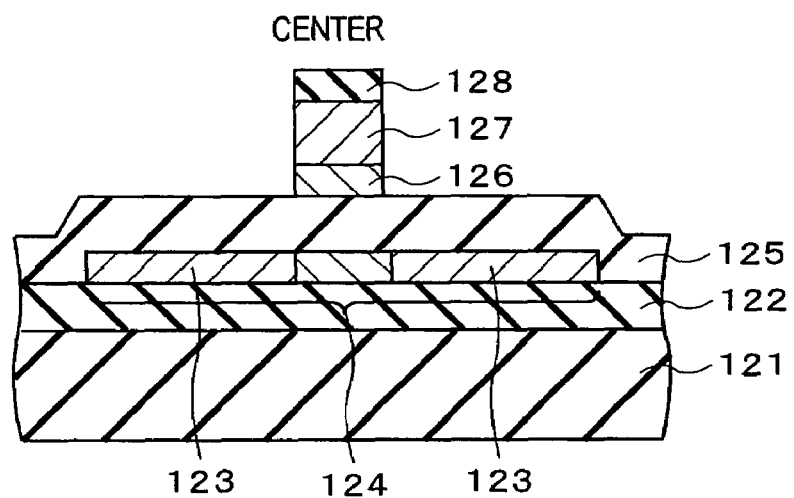
FIGS. 4A and 4B are cross sectional views showing a problem which occurs when a laser reflection film is formed on a gate electrode having a double-layer structure, with 4A showing a center of a substrate and 4B showing a periphery of the substrate.
Figure 4B:
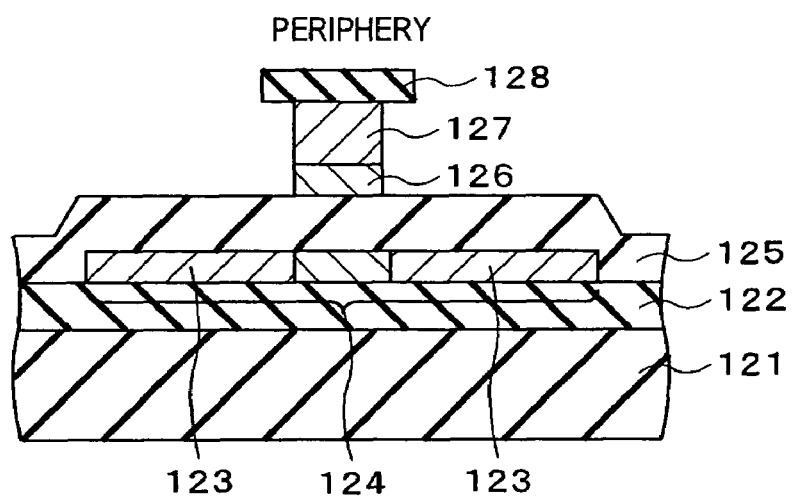

Further, in the semiconductor device according to the present embodiment, as in the semiconductor device according to the first embodiment described earlier, the total thickness $d_{SD}$ ($=d_{IL}+d_{GO}$) of the gate insulation layer 3 and the insulation layer 5 on an impurity-doped region 10 and the thicknesses $d_{Gate}$ of the insulation layer 5 on the gate electrode 6 are within the preferable ranges which are shown in FIG. 3. More preferably, the thicknesses $d_{GO}$, the thicknesses dRo and the thicknesses $d_{IL}$ are set so that $d_{Gate}$=90 nm and $d_{SD}$=150 nm are satisfied. The structures of the semiconductor device according to the present embodiment example other than the above are similar to those described earlier in relation to the semiconductor device according to the first embodiment.

Figure 13A:
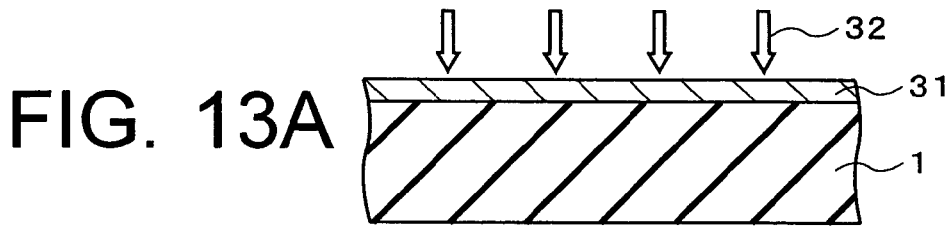
FIG. 13A through FIG. 13D are cross sectional views showing a method for manufacturing the semiconductor device according to the second embodiment of the present invention, in the order of manufacturing steps.
Figure 13B:
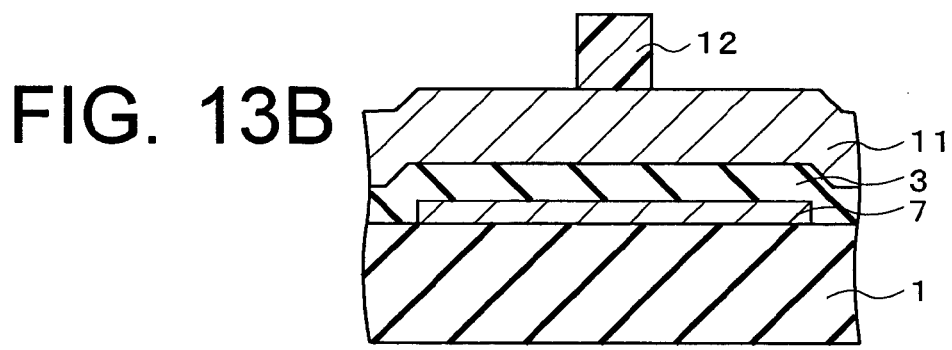

A method for manufacturing the semiconductor device according to the present embodiment will now be described. FIG. 13A through FIG. 13D are cross sectional views showing the method for manufacturing the semiconductor device according to the present embodiment, in the order of manufacturing steps. First, as shown in FIG. 13A, the amorphous-silicon layer 31 is formed on the transparent insulation substrate 1 of glass or the like by the CVD method and then turned into poly-silicon by annealing. After element isolation by etching, as shown in FIG. 13B, the gate insulation film 3 is formed by the CVD method, and by sputtering, the gate metal layer 11 in which a plurality of layers of mutually different materials are stacked up is deposited. The photo mask 12 is then formed by photolithography and the gate metal layer 11 is patterned, whereby the gate electrode 6 is formed. For the element isolation and the patterning of the gate electrode 6, dry etching may be used for instance.

Figure 13C:
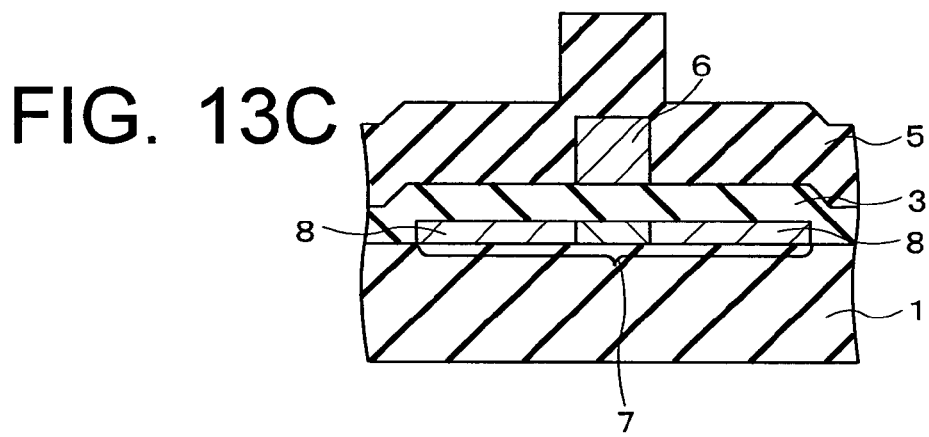

This is followed by impurity implantation as shown in FIG. 13C, forming the impurity-doped region 8. The impurity implantation may be performed with the photo mask 12 remaining as it is, or self-aligned using the gate electrode 6 as a mask. After removal of the photo mask 12, the insulation layer 5 is formed by the CVD method. The thickness of the insulation layer 5 is within the range $d_{Gate}$ shown in FIG. 7 at the wavelength of the laser that is used for the activation annealing.

Figure 13D:
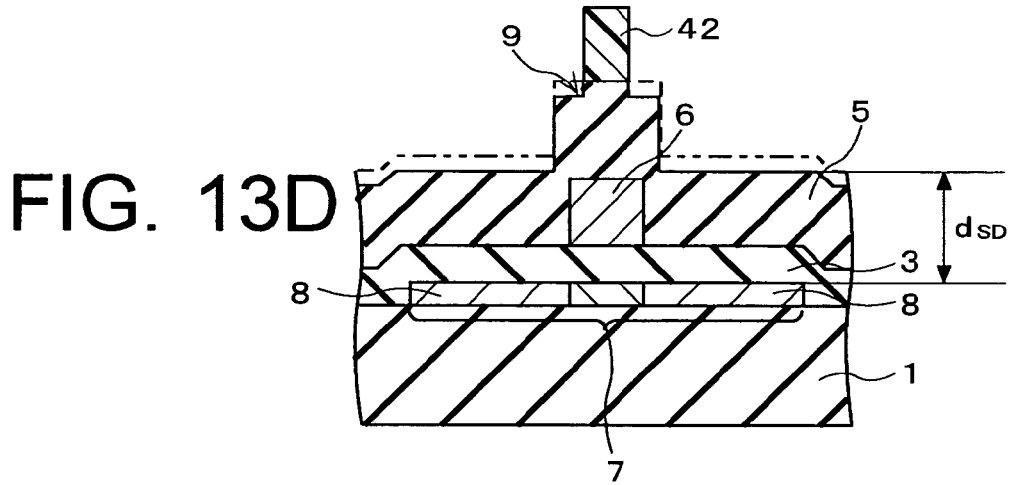

The width of a photo mask 42 is narrower than that of the gate electrode 6 is thereafter formed on the insulation layer 5 that is on the gate electrode 6 as shown in FIG. 13D. The reason for forming the width of the photo mask 42 narrower than that of the gate electrode 6 is to ensure a margin, considering the accuracy of lithography. After this, the amount of etching is adjusted so that such a thickness, which realizes $d_{SD}$ shown in FIG. 7 at the wavelength of the laser that is used for the activation annealing, will be obtained, and the insulation layer 5 is then etched. This creates the step 9, which is low in the periphery but high in the center, within the surface of the insulation layer 5. An excimer laser is then irradiated, thereby activating the impurity-doped region 8 and completing the TFT in the semiconductor device according to the present embodiment.

Figure 14A:
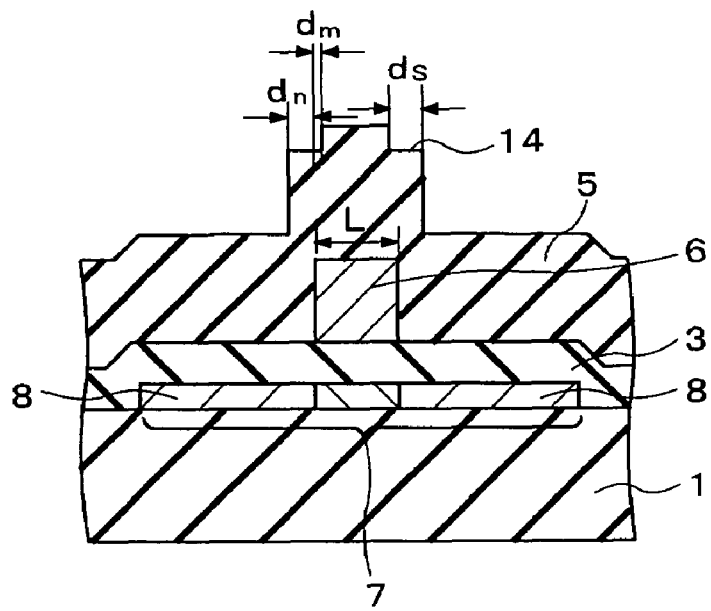
Figure 14B:
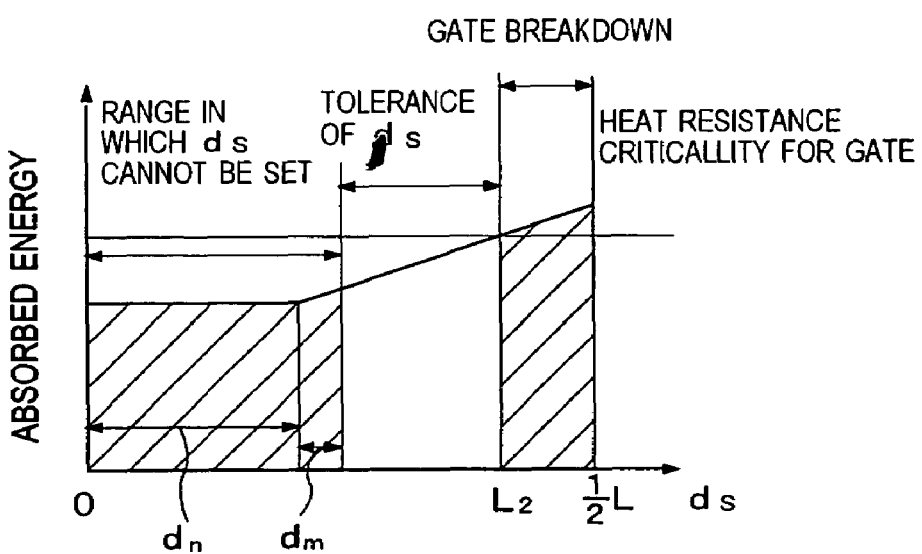
FIG. 14B is a graph showing a relationship between the width of the side-etched portion and absorbed energy at a gate electrode, with the horizontal axis representing the width of a step and the vertical axis representing the absorbed energy at the gate electrode.

The low portion of the step 9, namely, a side-etched portion 14 will now be described. FIG. 14A is a cross sectional view showing the side-etched portion in the semiconductor device according to the present embodiment, while FIG. 14B is a graph showing a relationship between the width of the side-etched portion and absorbed energy at the gate electrode, with the horizontal axis representing the width of the step and the vertical axis representing the absorbed energy at the gate electrode. In the semiconductor device according to the present embodiment, the insulation layer 5 is provided also on the side surfaces of the gate electrode 6, and there is the side-etched portion 14 created in the insulation layer 5 that is on the gate electrode 6 and on the side surfaces of the gate electrode 6. Due to this, in FIG. 14A and FIG. 14B, considering even the sections of the insulation layer 5 provided on the side surfaces of the gate electrode 6, the distance from the edge of the section of the insulation layer 5 provided on the side surface of the gate electrode 6 to the high portion in the center is defined as the width $d_s$ of the side-etched portion 14. In other words, $d_s$=0 holds in the pre-etching state shown in FIG. 13C. As described earlier, since the photo mask 42 is formed narrower than the gate electrode 6 to provide an alignment margin for lithography, the width $d_s$ of the side-etched portion 14 is inevitably equal to or wider than the sum $(d_m+d_n)$ of the alignment margin width $d_n$ and the covered thickness $d_n$ of the insulation layer 5.

Assuming the width of the gate electrode 6 is L, the absorbed energy exceeds critical value that will deal damage to gate electrode when $d_s=L_2$, which results in a defect. The width $d_s$ of the side-etched portion 14 is therefore set equal to or wider than the sum $(d_m+d_n)$ of the alignment margin width $d_m$ and the covered thickness $d_n$ of the insulation layer 5 but within such a range which ensures that the absorbed energy do not exceed the critical value, that is, $(d_m+d_n) \leq d_s < L_2$. While the value $L_2$ changes depending upon the materials of the gate electrode 6, the wavelength and the intensity of the laser beam which is used, etc., in the event that the activation process uses an excimer laser as in the case of the semiconductor device according to the present embodiment, the width $d_s$ is desirably equal to or narrower than ¼ of the width L of the gate electrode.

In the semiconductor device according to the present embodiment, since the surface of the insulation layer 5, which is formed as a laser reflection film on the gate electrode 6, has the step which is high in the center but low in the periphery, the insulation layer 5 is assured not to form overhang even the cross sectional shape varies between the center and the periphery of the substrate due to the non-uniformity of the process. In addition, since the total thickness of the insulation layer 5 formed on the center of the gate electrode 6 is set so that the reflectance of the laser beam will be high and the total thickness of the gate insulation layer 3 and the insulation layer 5 formed on the impurity-doped region 8 is set so that the reflectance of the laser beam will be low, it is possible to activate the impurities by excimer laser annealing without damaging the gate electrode 6. Further, in the semiconductor device according to the present embodiment, as the step is created by etching on the insulation layer 5, the shape of the step is obtained accurately.

Although the semiconductor devices according to the first and the second embodiments of the present invention described above require forming the poly-silicon layer 7 on the insulation substrate 1, the present invention is not limited to this: For instance, on the insulation substrate 1, an underlying insulation layer which prevents diffusion of the impurities from the insulation substrate 1 may be formed and the poly-silicon layer 7 may be formed on the underlying insulation layer. Further, in these semiconductor devices, sidewalls may be provided on the both side surfaces of the gate electrode 6. In addition, although the activation process uses an excimer laser whose wavelength is 308 nm in the first and the second embodiments, the present invention is not limited to this: For example, similar effects are obtained also with laser beam having a wavelength of 248 nm.

Figure 15:
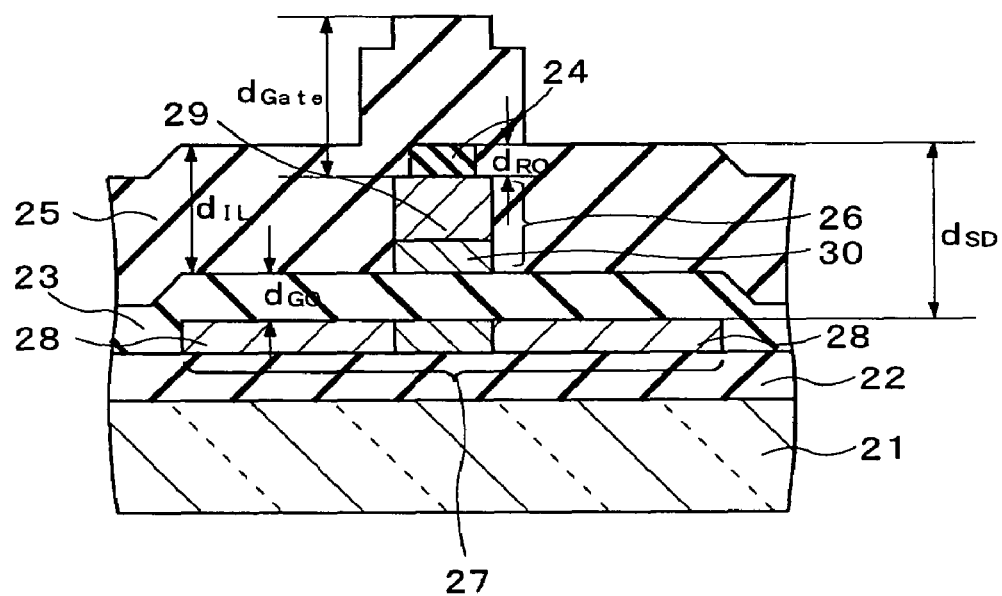
FIG. 15 is a cross sectional view showing a semiconductor device according to a first example of the present invention.

The effects according to examples of the present invention will now be described in detail. FIG. 15 is a cross sectional view showing a semiconductor device according to a first example of the present invention. First, as the first example of the present invention, such a TFT was fabricated in which a poly-silicon layer 27 comprising an impurity-doped region 28 was formed on a glass substrate 21 which included a underlying SiO₂ layer 22 which in order to prevent surface diffusion of impurities, a gate electrode 26 having a double-layer structure in which a micro-crystalline silicon layer 30 and a Cr layer 29 are stacked up was formed on the poly-silicon layer 27 via a gate SiO₂ layer 23, a SiO₂ reflection modifier layer 24 was formed on the gate electrode 26 to adjust reflectance of the laser beam, and an inter-layer SiO₂ layer 25 was formed covering the entire structure. With respect to the thicknesses of the respective layers in the semiconductor device according to this example, the thickness of the underlying SiO₂ layer 22 was 2000 to 5000 angstroms, that of the poly-silicon layer 27 was 400 to 800 angstroms, and that of the gate SiO₂ layer 23, which was to be determined in accordance with applied products, was set to 1000 angstroms in this example. The thicknesses of the micro-crystalline silicon layer 30 and the Cr layer 29 in the gate electrode 26 were 500 to 1000 angstroms and 2000 to 3000 angstroms, respectively. Further, that of the SiO₂ reflection modifier layer 24 was 500 angstroms, and that of the inter-layer SiO₂ layer 25 was 1500 to 5500 angstroms.

Figure 16:
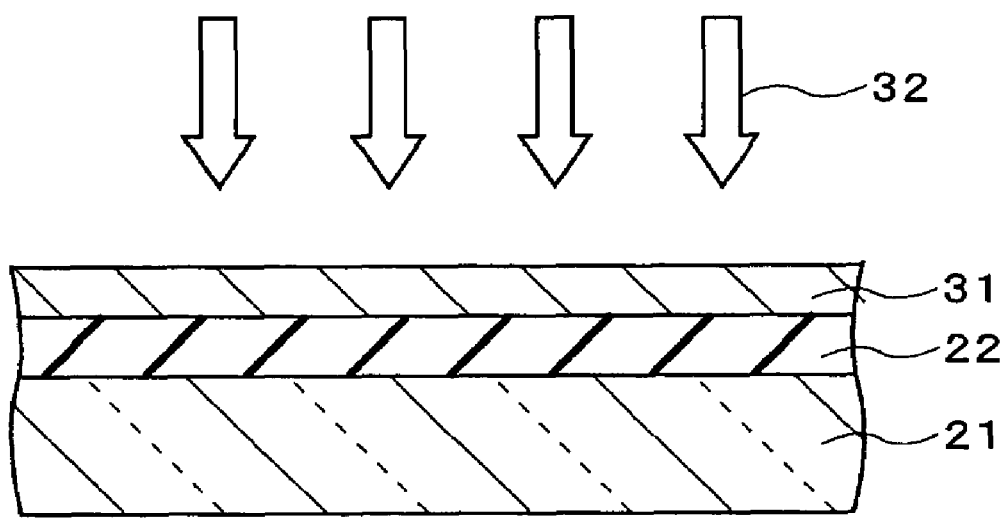
FIG. 16 is a cross sectional view which showing a method for manufacturing the semiconductor device according to the first example of the present invention.
Figure 17:
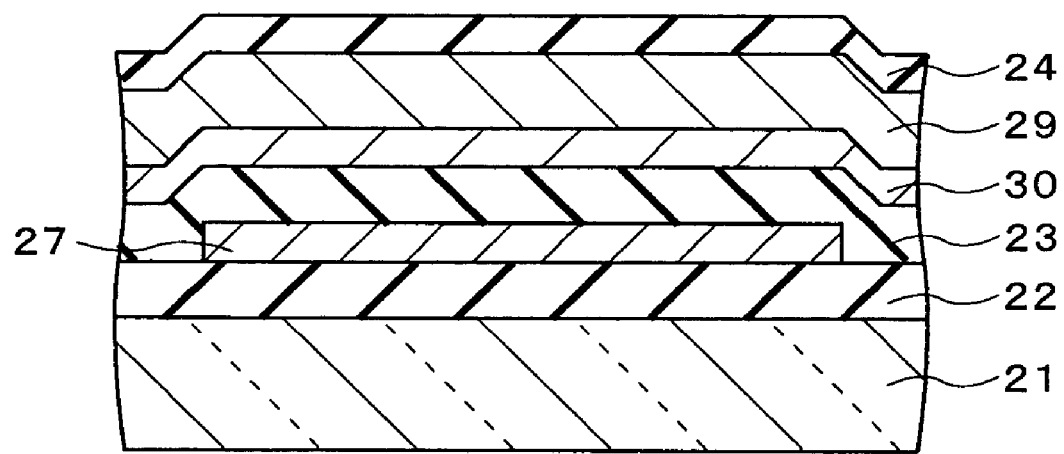
FIG. 17 is a cross sectional view showing a step that follows FIG. 16 in the method for manufacturing the semiconductor device according to the first example of the present invention.
Figure 22:
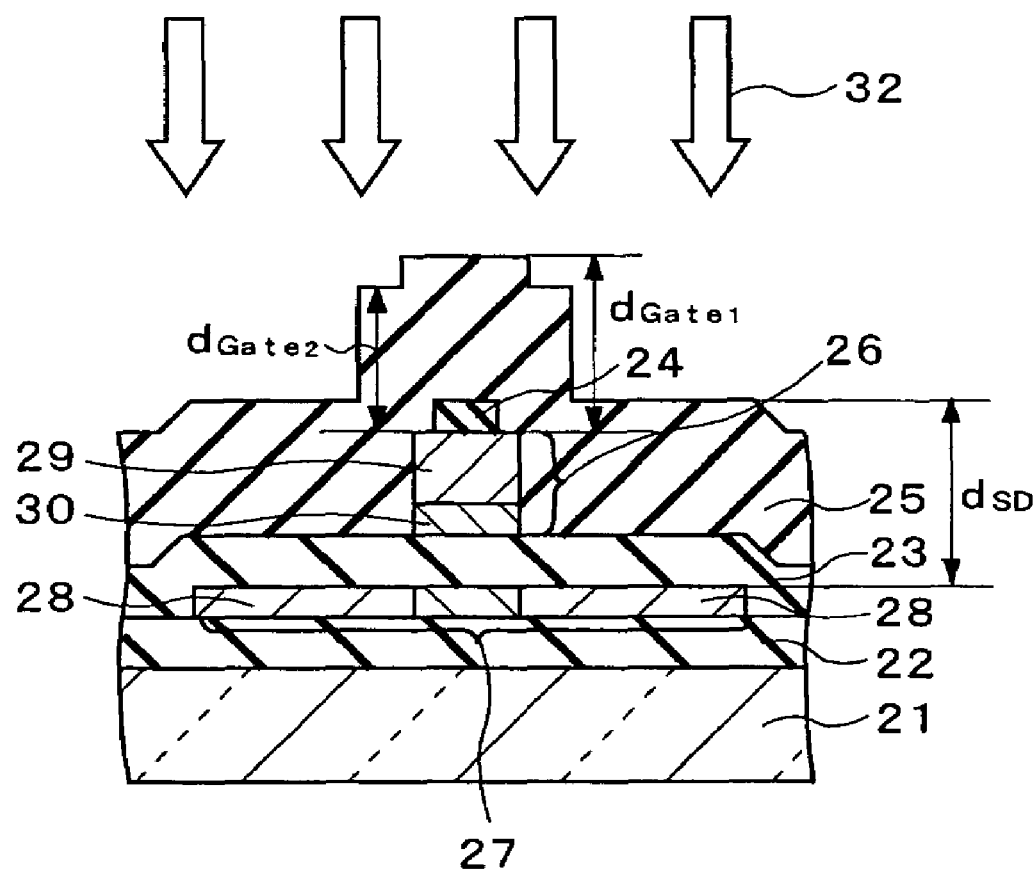
FIG. 22 is a cross sectional view showing a step that follows FIG. 21 in the method for manufacturing the semiconductor device according to the first example of the present invention.
Figure 23:
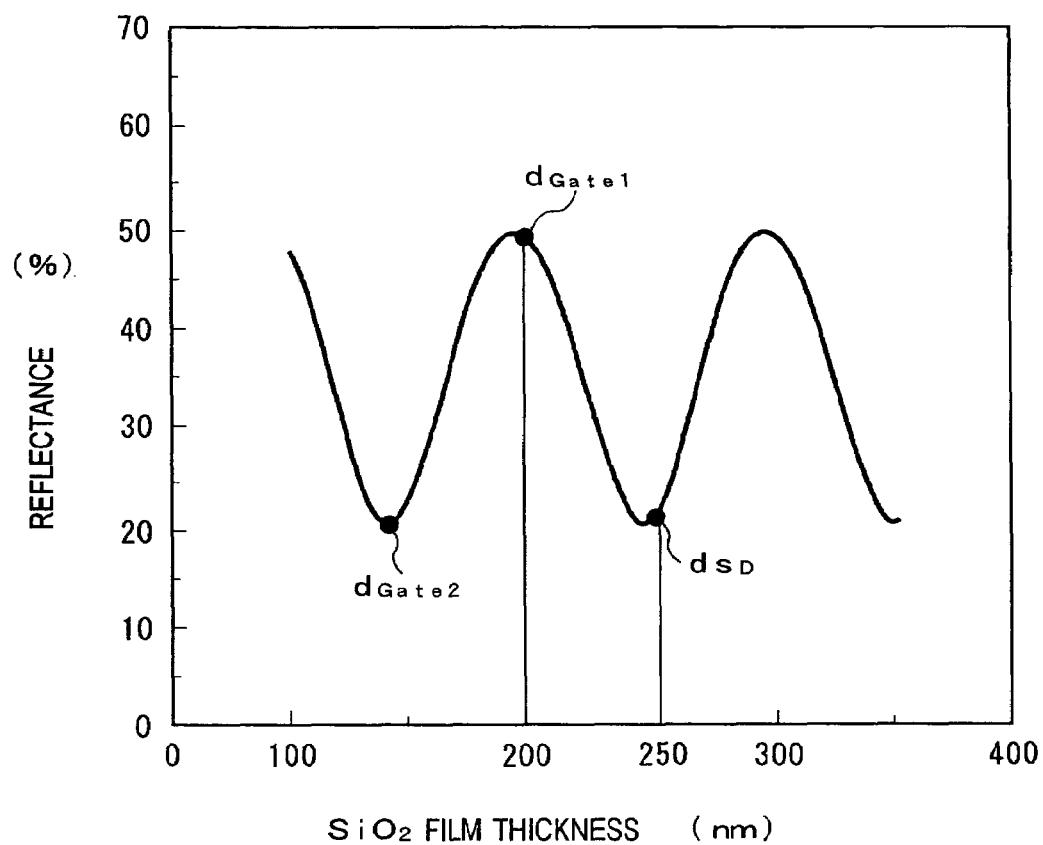
FIG. 23 is a graph showing a relationship between a thickness of a $SiO_2$ film and the reflectance of light of 308 nm, with the horizontal axis representing the thickness of the $SiO_2$ film and the vertical axis representing the reflectance of the 308-nm light.

A method for manufacturing the semiconductor device according to this example will now be described. FIG. 16 through FIG. 22 are cross sectional views showing the method for manufacturing the semiconductor device according to this example, in the order of manufacturing steps. FIG. 18A through 21A are cross sectional views of the center of the substrate, whereas FIG. 18B through FIG. 21B are cross sectional views showing the periphery of the substrate. FIG. 23 is a graph showing a relationship between a thickness of a SiO₂ film and the reflectance of light of 308 nm, with the horizontal axis representing the thickness of the SiO₂ film and the vertical axis representing the reflectance of the 308-nm light. First, after forming the underlying SiO₂ layer 22 from 2000 to 5000 angstroms by the CVD method on the glass substrate 21 as shown in FIG. 16, the amorphous-silicon layer 31 was formed from 400 to 800 angstroms by the CVD method. An excimer laser beam 32 was then irradiated, whereby the amorphous-silicon layer 31 was annealed and crystallized into poly-silicon. This was followed by element isolation through dry etching, thereby forming the gate SiO₂ layer 23 for 1000 angstroms by the CVD method as shown in FIG. 17. To be more specific, after forming the micro-crystalline silicon layer 30 forming the gate electrode 26 from 500 to 1000 angstroms by the CVD method, the Cr layer 30 was deposited 2000 to 3000 angstroms by sputtering, and further by the CVD method, the SiO₂ reflection modifier layer 24 was formed 500 angstroms.

The photo mask 12 was then formed by photolithography, followed by creation of the three layers of the SiO₂ reflection modifier layer 24, the Cr layer 29 and the micro-crystalline silicon layer 30 by dry etching. A dry etching method to form the gate electrode in this example will now be described in detail, in the order of the processing sequence. At the steps of forming the gate electrode shown in FIG. 18 through FIG. 20, while maintaining vacuum within one processing chamber, etching was performed continuously under three types of conditions shown in Table 1 below.

TABLE 1

| LAYER TO CONTROL | CONDITION |
|---|---|
| SiO₂ REFLECTION MODIFIER LAYER | CHF₃(113 ccm) + CO(37 ccm), 1500 W, 1.9 Pa |
| GATE ELECTRODE Cr LAYER | 1st: Cl₂(250 ccm) + O₂(150 ccm) + He(250 ccm), 1400 W, 40.0 Pa |
| | 2nd: Cl₂(75 ccm) + O₂(125 ccm) + He(75 ccm), 1400 W, 10.0 Pa |
| GATE ELECTRODE μc-Si LAYER | 1st: Cl₂(40 ccm) + CF₄(80 ccm) + O₂(20 ccm), 1000 W, 5.0 Pa |
| | 2nd: Cl₂(100 ccm) + CF₄(40 ccm) + He(75 ccm), 500 W, 3.0 Pa |
| | 3rd: Cl₂(100 ccm) + CF₄(40 ccm) + He(75 ccm), 300 W, 3.0 Pa |

Figure 18A:
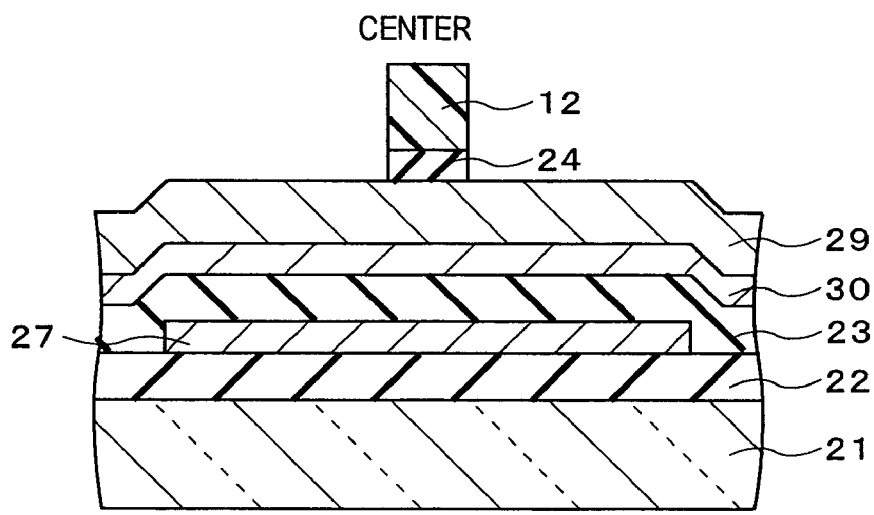
FIG. 18A and FIG. 18B are cross sectional views showing a step which follows FIG. 17 in the method for manufacturing the semiconductor device according to the first example of the present invention.
Figure 18B:
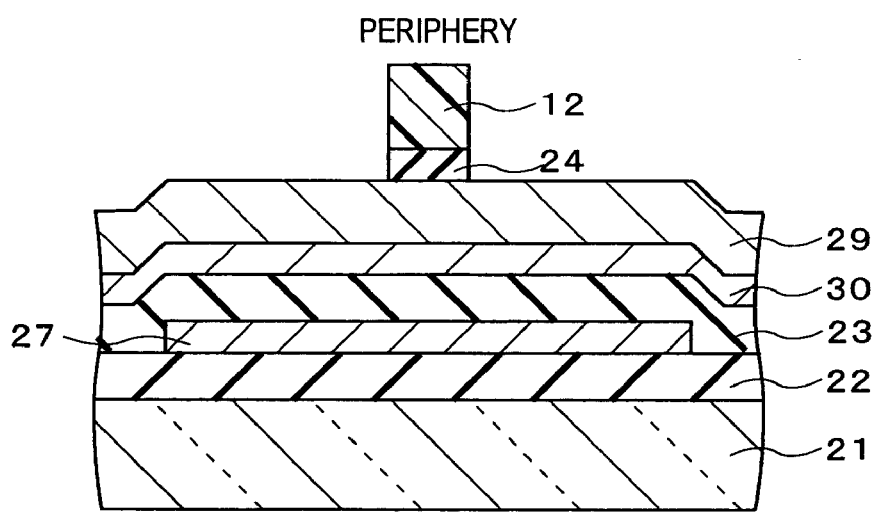
Figure 19A:
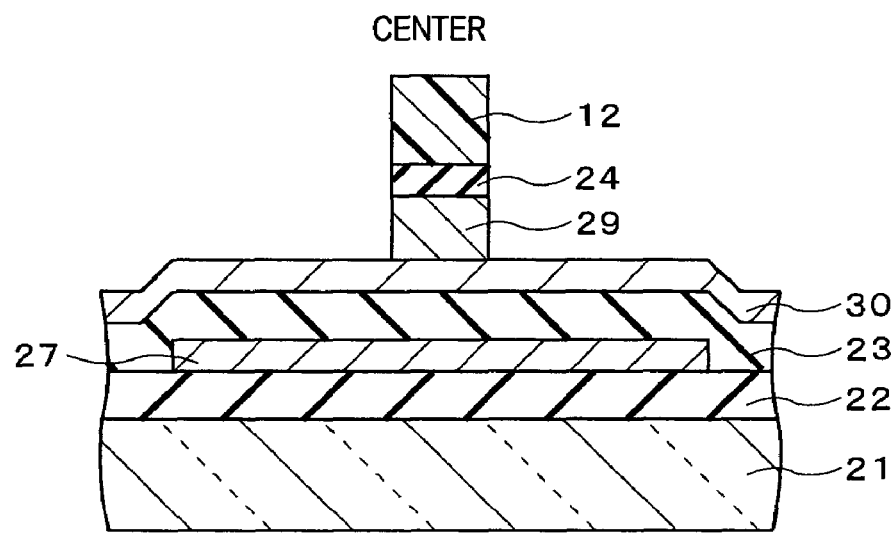
FIG. 19A and FIG. 19B are cross sectional views showing a step which follows FIG. 18 in the method for manufacturing the semiconductor device according to the first example of the present invention.
Figure 19B:
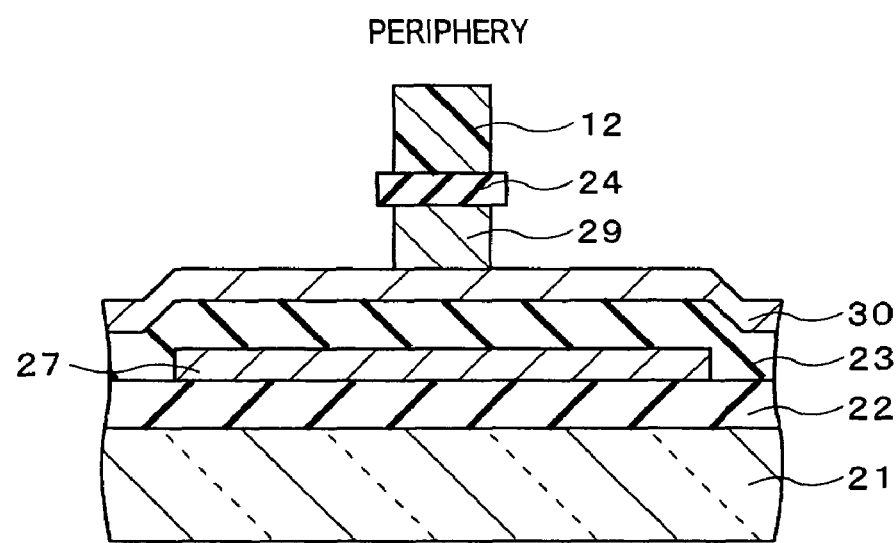

First, the SiO₂ reflection modifier layer 24 was etched. As shown in FIG. 18A and FIG. 18B, at this step, no shape difference was generated between the center of the substrate and the periphery of the substrate. The Cr layer 29 was then etched, and due to different etching speeds between the center of the substrate and the periphery of the substrate and since the etching speed of Cr was relatively faster in the center of the substrate, the SiO$_2$ reflection modifier layer 24 overhung as shown in FIG. 19A and FIG. 19B. This is attributable to uneven etching of Cr during processing of the large-size glass substrate.

Figure 20A:
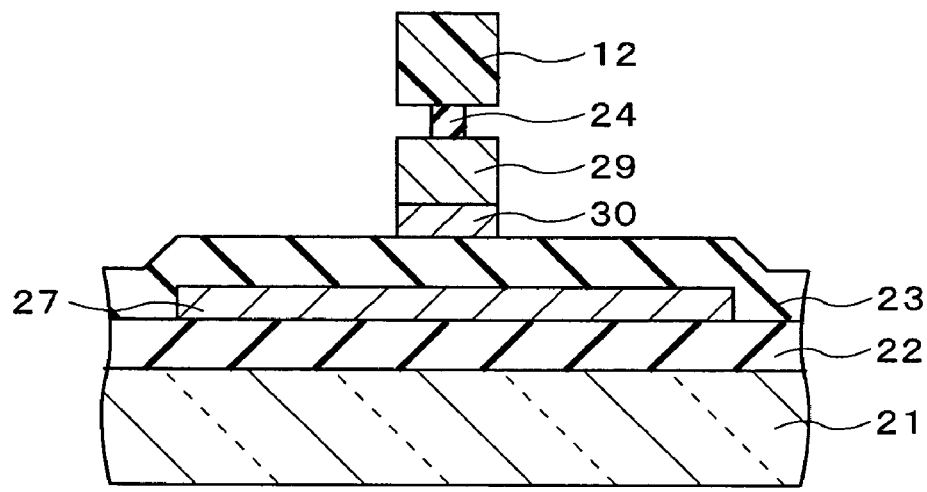
FIG. 20A and FIG. 20B are cross sectional views showing a step which follows FIG. 19 in the method for manufacturing the semiconductor device according to the first example of the present invention.
Figure 20B:
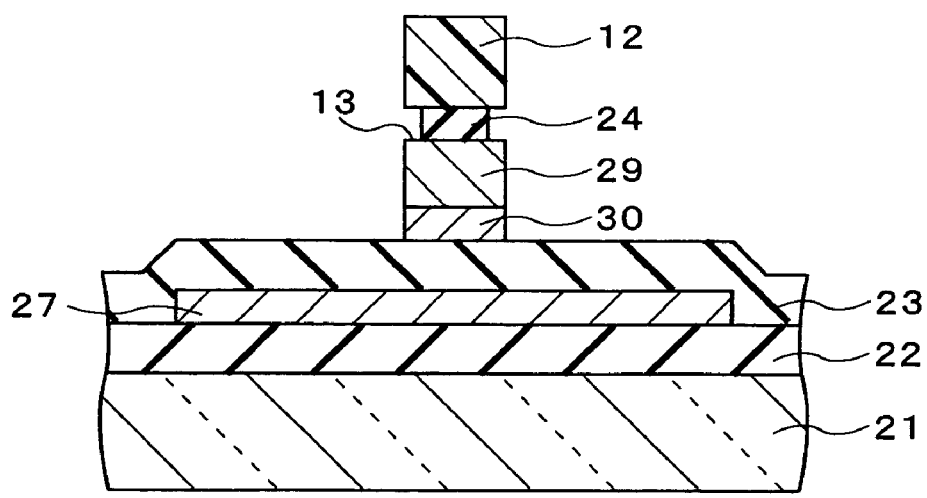
Figure 21A:
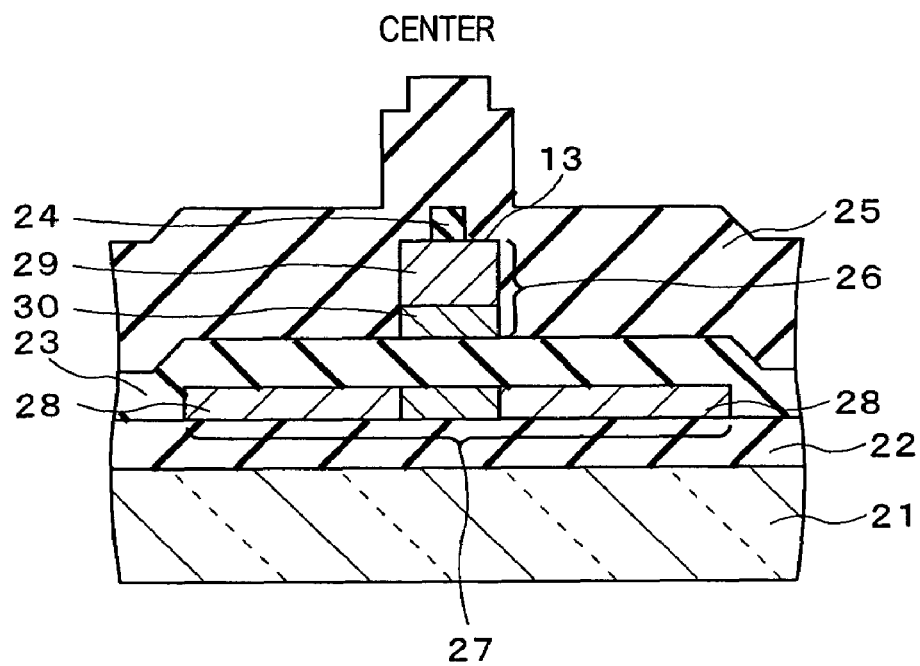
FIG. 21A and FIG. 21B are cross sectional views showing a step which follows FIG. 20 in the method for manufacturing the semiconductor device according to the first example of the present invention.
Figure 21B:
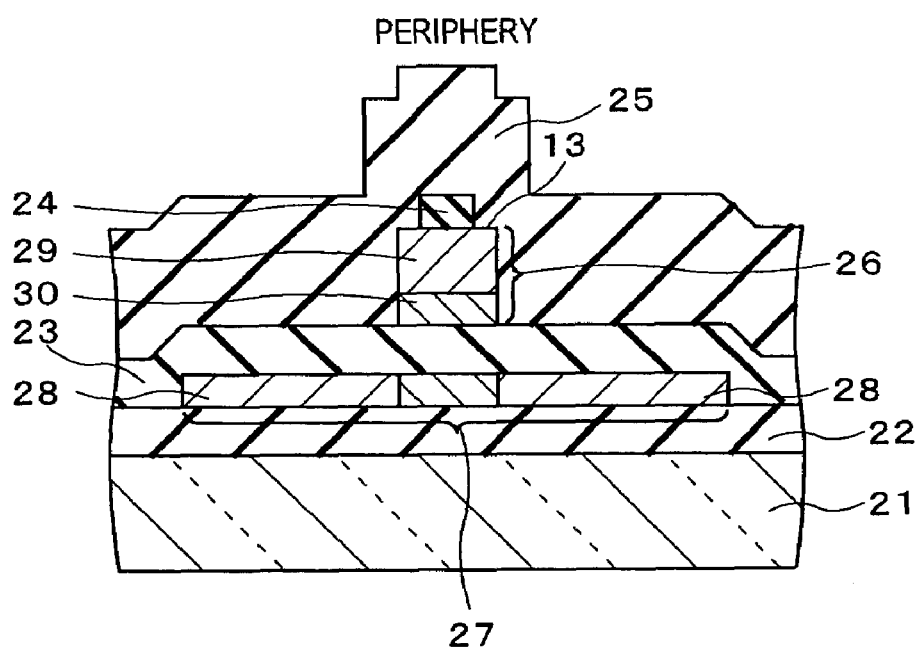

The micro-crystalline silicon layer 30 was thereafter etched, and since an etching speed difference between SiO$_2$ and micro-crystalline silicon was small, horizontal etching went fast and the side-etched portion 13 was created in the SiO$_2$ reflection modifier layer 24 as shown in FIG. 20A and FIG. 20B. Next, impurities were implanted self-aligned using the gate electrode 26 as a mask by an ion doping method and the inter-layer SiO$_2$ layer 25 was then formed over the entire structure, thereby obtaining the semiconductor device having the shape as that shown in FIG. 21A and FIG. 21B.

The impurity-doped region was then activated by excimer laser annealing. As shown in FIG. 22 and FIG. 23, in the semiconductor device according to this example, since the total thickness $d_{SD}$ of the SiO$_2$ layers formed on the impurity-doped region 28 was 250 nm, the reflectance was approximately the lowest. Owing to this, the energy of the excimer laser reached the impurity-doped region 28 at the maximum efficiency, which provided sufficient energy for activation of the impurities. Meanwhile, as for the SiO$_2$ layers formed on the gate electrode 26, since the width of the SiO$_2$ reflection modifier layer 24 was narrower than that of the gate electrode 26, the total thickness of the SiO$_2$ layers became $d_{Gate1}$=200 nm in some sections and $d_{Gate2}$=150 nm in other sections. The reflectance was approximately the lowest in the section of $d_{Gate2}$=150 nm, and therefore, the energy of the excimer laser reached the gate electrode at the maximum efficiency. On the contrary, the reflectance was approximately the highest in the section of $D_{Gate1}$=200 nm, and the energy of the excimer laser reached the gate electrode at the minimum efficiency. In this semiconductor device, impurity activation was successfully taken place without deforming or evaporating of gate electrode 26 since the area which has $d_{Gate1}$ of 200 nm was sufficiently lager than the area which has $d_{Gate2}$ of 150 nm and the energy absorbed by the gate electrode will not exceed the critical value that induces distortion of the gate electrode 26.

Figure 24:
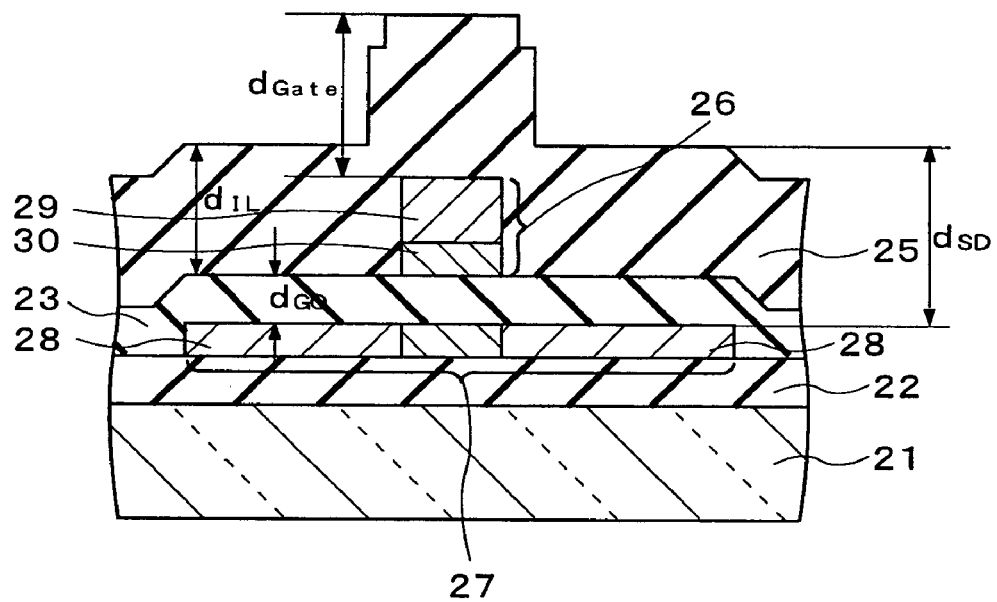
FIG. 24 is a cross sectional view showing a structure of the semiconductor device according to the second example of the present invention.

The semiconductor device according to the second example will now be described. FIG. 24 is a cross sectional view showing the structure of the semiconductor device according to this example. As shown in FIG. 24, as the second example of the present invention, such a TFT was fabricated in which the poly-silicon layer 27 comprising the impurity-doped region 28 was formed on the glass substrate 21 which included the underlying SiO$_2$ layer 22, the gate electrode 26 having a double-layer structure in which the micro-crystalline silicon layer 30 and the Cr layer 29 are stacked up was formed on the poly-silicon layer 27 via the gate SiO$_2$ layer 23, and the inter-layer SiO$_2$ layer 25 was formed covering the entire structure. With respect to the thicknesses of the respective layers, the thickness of the underlying SiO$_2$ layer 22 was 2000 to 5000 angstroms, that of the poly-silicon layer 27 was 400 to 800 angstroms, that of the gate SiO$_2$ layer was 1000 angstroms, that of the micro-crystalline silicon layer 30 was 500 to 1000 angstroms, that of the Cr layer 29 was 2000 to 3000 angstroms, and that of the inter-layer SiO$_2$ layer 25 was 2000 to 5000 angstroms.

Figure 25:
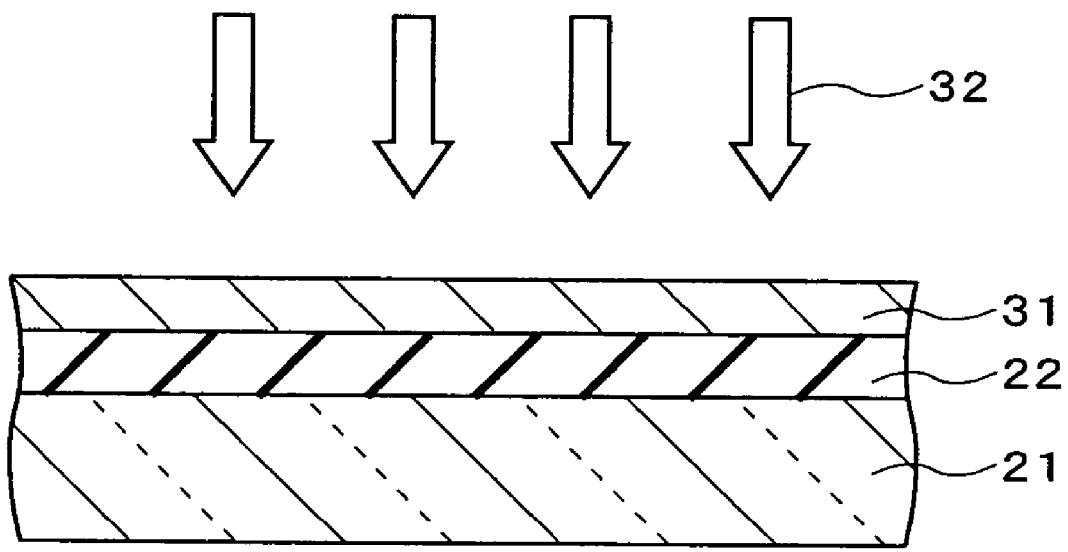
FIG. 25 is a cross sectional view showing a method for manufacturing the semiconductor device according to the second example of the present invention.
Figure 26:
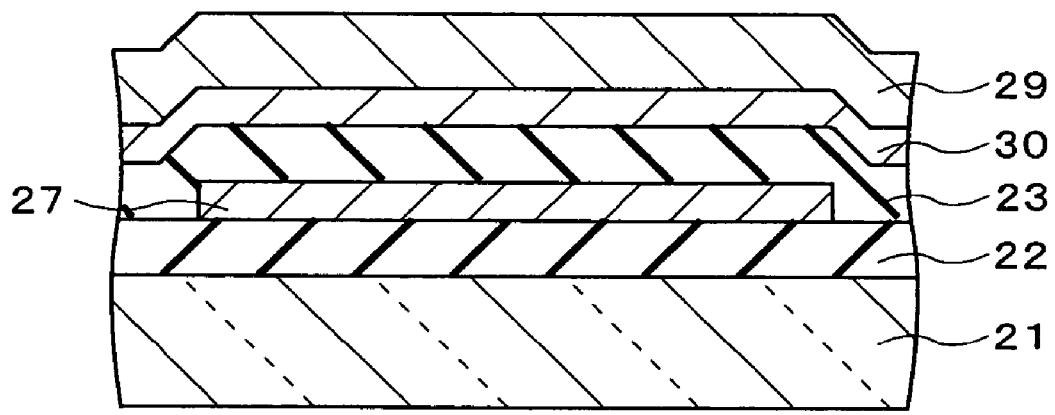
FIG. 26 is a cross sectional view showing a step that follows FIG. 25 in the method for manufacturing the semiconductor device according to the second example of the present invention.
Figure 27:
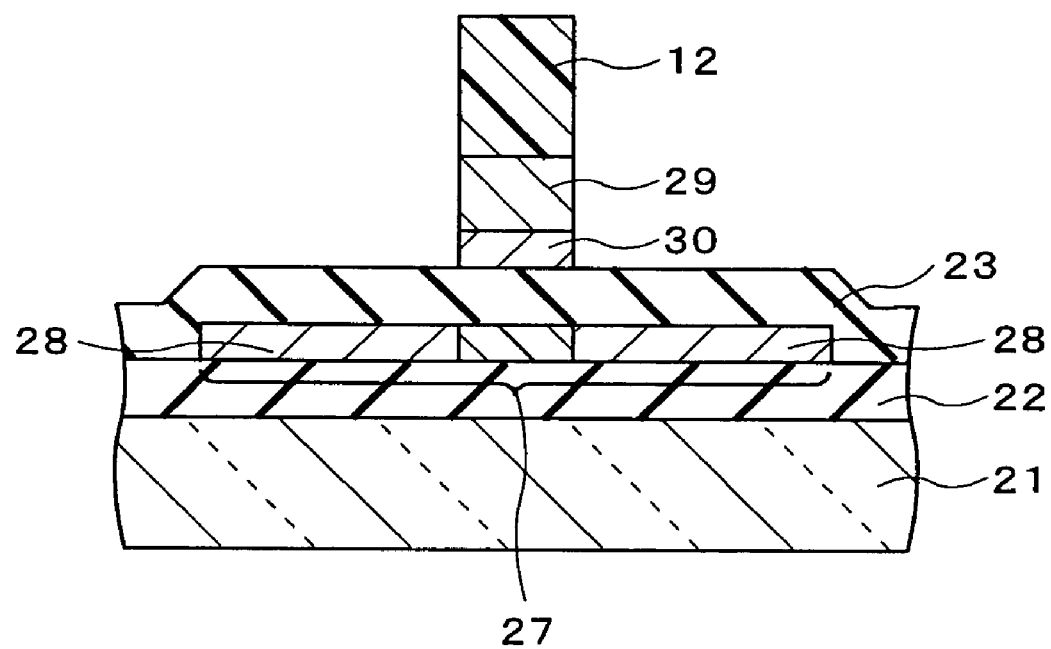
FIG. 27 is a cross sectional view showing a step that follows FIG. 26 in the method for manufacturing the semiconductor device according to the second example of the present invention.
Figure 28:
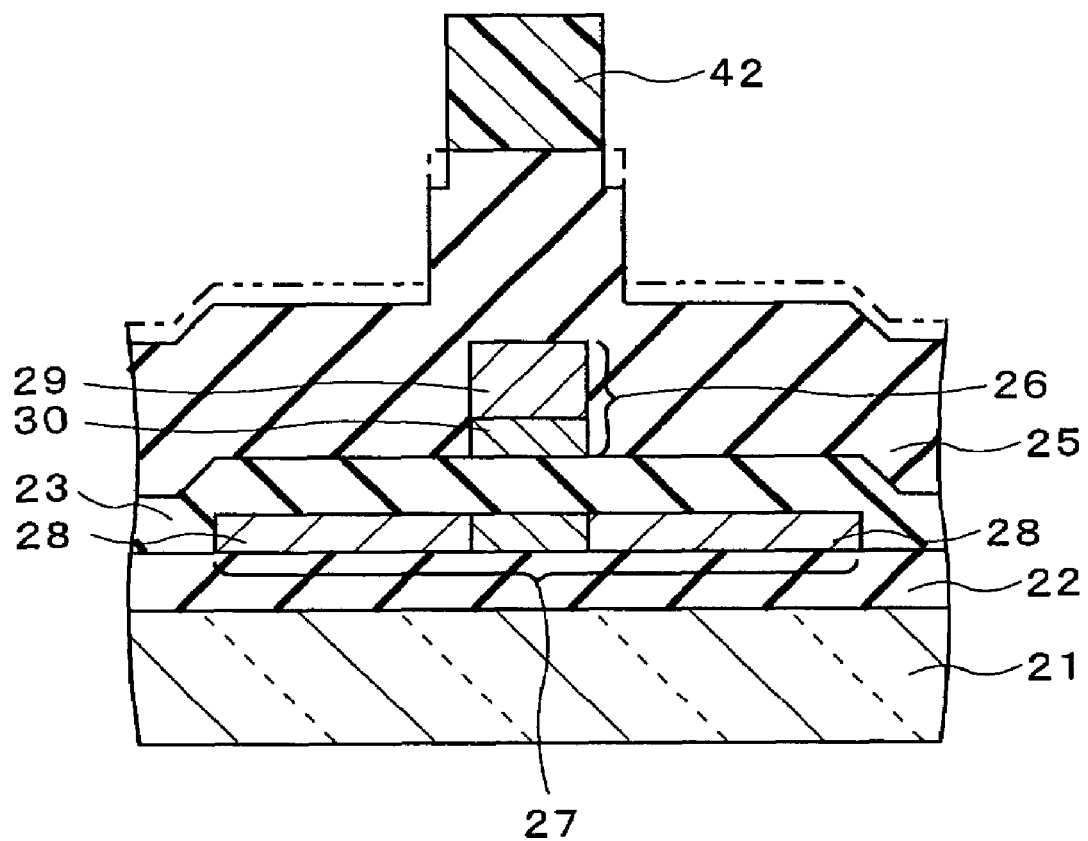
FIG. 28 is a cross sectional view showing a step that follows FIG. 27 in the method for manufacturing the semiconductor device according to the second example of the present invention.

FIG. 25 through FIG. 29 are cross sectional views which show the method for manufacturing the semiconductor device according to the present embodiment, in the order of manufacturing steps. First, after forming the underlying SiO$_2$ layer 22 from 2000 to 5000 angstroms by the CVD method on the glass substrate 21 as shown in FIG. 25, the amorphous-silicon layer 31 was formed from 400 to 800 angstroms by the CVD method. The excimer laser beam 32 was then irradiated, whereby the amorphous-silicon layer 31 was annealed and crystallized into poly-silicon. This was followed by element isolation through dry etching, thereby forming the gate SiO$_2$ layer 23 for 500 to 1000 angstroms by the CVD method as shown in FIG. 26. Next, after forming the micro-crystalline silicon layer 30 forming the gate electrode from 500 to 1000 angstroms by the CVD method, Cr was deposited 2000 to 3000 angstroms by sputtering. The photo mask 12 was then formed by photolithography as shown in FIG. 27, and the gate electrode 26 was formed by dry etching. After forming the gate electrode 26, the impurity-doped region 28 was formed self-aligned using the gate electrode 26 as a mask by ion doping. After the inter-layer SiO$_2$ layer 25 was then formed over the entire structure, the photo mask 42 was formed on the gate electrode and the inter-layer SiO$_2$ layer 25 was removed 500 angstroms, thereby obtaining the semiconductor device having the shape as that shown in FIG. 28.

Figure 29:
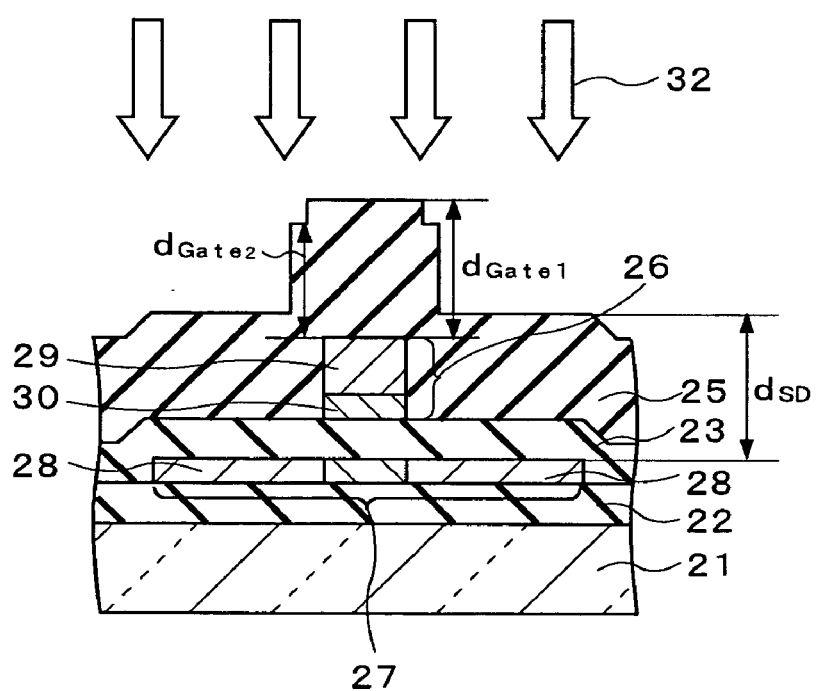
FIG. 29 is a cross sectional view showing a step that follows FIG. 28 in the method for manufacturing the semiconductor device according to the second example of the present invention.

The impurity-doped region was then activated by exciter laser annealing as shown in FIG. 29. In the semiconductor device according to the present embodiment, since the total thickness of the SiO$_2$ layers on the impurity-doped region 28 was 250 nm, the reflectance was approximately the lowest. Therefore, the energy of the excimer laser reached the impurity-doped region 28 at the maximum efficiency, which provided sufficient energy for activation of the impurities. Meanwhile, as for the SiO$_2$ layers formed on the gate electrode, the total thickness of the SiO$_2$ layers became $d_{Gate1}$=200 nm in some sections and $d_{Gate2}$=150 nm in other sections. The reflectance was approximately the lowest in the section of $d_{Gate2}$=150 nm, and therefore, in this section, the energy of the excimer laser reached the gate electrode at the maximum efficiency. On the contrary, the reflectance was approximately the highest in the section of $d_{Gate1}$=200 nm, and the energy of the excimer laser reached the gate electrode at the minimum efficiency. In this TFT, impurity activation was successfully taken place without deforming or evaporating of gate electrode 26 since the area that has $d_{Gate1}$ of 200 nm was sufficiently larger than the area that has $d_{Gate1}$ of 150 nm and the energy absorbed by the gate electrode will not exceed the critical value that induces distortion of the gate electrode 26.

What is claimed is:

1. A semiconductor device, comprising:
    a transparent insulation substrate;
    a poly-silicon layer formed on said substrate;
    a laser-irradiated source region and a separate laser-irradiated drain region in an impurity-doped region in said poly-silicon layer;
    a channel region formed between said source region and said drain region in said poly-silicon layer;
    a first insulation layer which is formed on said poly-silicon layer and which is to serve as a gate insulation layer;
    a gate electrode having a plurality of stacked layers of mutually different materials, said gate electrode being formed on a portion of said first insulation layer that is above said channel region; and
    a second insulation layer which covers said gate electrode and said gate insulation layer, said second insulation layer having a surface with a step above said gate electrode, in which the surface of said second insulation layer is low above a periphery of said gate electrode but high in a center of said gate electrode, wherein said source region and said drain region are formed by irradiation of laser beam through said first insulation layer and said second insulation layer, the reflectance of said laser beam at a portion of said second insulation layer above the center of said gate electrode is higher than the reflectance of the laser beam at portions of a first multi-layer insulation film consisting of said first insulation layer and said second insulation layer above said source region and said drain region, and wherein the width of said step formed in the surface of said second insulation layer is equal to or narrower than ¼ of the width of said gate electrode.

2. The semiconductor device of claim 1, wherein on the center of said gate electrode, there is a third insulation layer which has a narrower width than said gate electrode in the traverse section and is formed of the same material as said second insulation layer, and the reflectance of said laser beam at a portion of a second multi-layer insulation film consisting of said third insulation layer and said second insulation layer above said gate electrode, is higher than the reflectance of the laser beam at said first multi-layer insulation film.

3. The semiconductor device of claim 1, wherein said first insulation layer and said second insulation layer are formed of $SiO_2$.

4. The semiconductor device of claim 1, wherein said gate electrode is formed of a micro-crystalline silicon layer and a Cr layer.

5. The semiconductor device of claim 1, wherein a Lightly Doped Drain region is formed in said impurity-doped region.

6. A display device, comprising the semiconductor device according to claim 1.

* * * * *